(12) United States Patent
Otose

(10) Patent No.: US 8,462,096 B2
(45) Date of Patent: Jun. 11, 2013

(54) SHIFT REGISTER, DISPLAY AND METHOD FOR DRIVING SHIFT REGISTER

(75) Inventor: Tomohiko Otose, Kawasaki (JP)

(73) Assignee: NLT Technologies, Ltd., Kanagawa (JP)

( * ) Notice: Subject to any disclaimer, the term of this patent is extended or adjusted under 35 U.S.C. 154(b) by 676 days.

(21) Appl. No.: 12/575,101

(22) Filed: Oct. 7, 2009

(65) Prior Publication Data

US 2010/0085294 A1 Apr. 8, 2010

(30) Foreign Application Priority Data

Oct. 8, 2008 (JP) ................................. 2008-262052

(51) Int. Cl.
*G09G 3/36* (2006.01)

(52) U.S. Cl.
USPC .............................. 345/100; 345/204; 377/64

(58) Field of Classification Search
USPC ................. 345/76, 82, 87, 98–100, 204–206; 377/64–81
See application file for complete search history.

(56) References Cited

U.S. PATENT DOCUMENTS

| | | | | |
|---|---|---|---|---|
| 5,247,215 A * | 9/1993 | Atriss et al. ..................... 327/40 |
| 6,928,135 B2 | 8/2005 | Sasaki et al. |
| 8,089,446 B2 * | 1/2012 | Pak et al. ....................... 345/100 |
| 8,106,874 B2 * | 1/2012 | Chiang et al. ................. 345/100 |
| 2002/0150199 A1 | 10/2002 | Sasaki et al. |
| 2003/0227433 A1 * | 12/2003 | Moon ........................... 345/100 |
| 2006/0012593 A1 | 1/2006 | Iriguchi et al. |
| 2006/0256066 A1 | 11/2006 | Moon |
| 2007/0182686 A1 * | 8/2007 | Chen et al. ...................... 345/98 |
| 2009/0129535 A1 * | 5/2009 | Chen ............................... 377/69 |
| 2010/0067646 A1 * | 3/2010 | Liu et al. ......................... 377/69 |

FOREIGN PATENT DOCUMENTS

| | | |
|---|---|---|
| JP | 2002-313093 A | 10/2002 |
| JP | 2006-030512 A | 2/2006 |
| JP | 2006-317566 A | 11/2006 |
| JP | 2008-140490 A | 6/2008 |

OTHER PUBLICATIONS

Chinese Office Action issued Mar. 15, 2013 in counterpart Chinese Application No. 200910179029.X.

* cited by examiner

*Primary Examiner* — Tom Sheng
(74) *Attorney, Agent, or Firm* — Sughrue Mion, PLLC

(57) ABSTRACT

A shift register comprises: a first output circuit controlled by a first clock signal to output a signal to a first output signal line; a second output circuit controlled by a second clock signal with a phase different from a phase of the first clock signal to output a signal to a second output signal line; a first control signal line connected to the first and second output circuits; and a second control signal line connected to the first and second output circuits.

11 Claims, 21 Drawing Sheets

REFERENCE CASE

_(1)_

SHIFT REGISTER, DISPLAY AND METHOD FOR DRIVING SHIFT REGISTER

REFERENCE TO RELATED APPLICATION

This application is based upon and claims the benefit of the priority of Japanese patent application No. 2008-262052 filed on Oct. 8, 2008, the disclosure of which is incorporated herein in its entirety by reference thereto.

TECHNICAL FIELD

This invention relates to a shift register, a display employing the shift register, and a method for driving the shift register. More particularly, it relates to a shift register including only a set of NMOS thin film transistors or a set of PMOS thin film transistors, a display employing the shift register, and a method for driving the shift register.

BACKGROUND

A flat display, represented by a liquid crystal display, is thin in thickness, lightweight and low in power consumption, and hence has recently been used as a display for a variety of devices. In these days, to further reduce the thickness, weight and cost, such a technique has been established in which a driving circuit is constructed using low-temperature polysilicon thin-film transistors, higher in electron mobility than conventional amorphous silicon thin-film transistors, and in which the so constructed driving circuit is formulated as one with a glass substrate.

As a driving circuit, a CMOS (Complementary MOS) circuit, made up of an NMOS transistor and a PMOS transistor, is routinely used. However, this technique suffers a problem that the manufacturing process has many process steps and hence is costly. To solve this problem, such a driving circuit composed only of transistors of one polarity, that is, only one of a set of NMOS transistors or a set of PMOS transistors, has been proposed. In Patent Document 1, a shift register composed only of a set of PMOS transistors (FIG. 2 of Patent Document 1) is described. The shift register of Patent Document 1 is composed of PMOS transistors T1 to T8, and yields an output signal OUT by activating power supply VDD and entering input signal IN and clock signals C1 to C3.

Meanwhile, there is an increasing demand for higher resolution of a liquid crystal device. The reason is that, if the resolution is improved, the amount of the information that may be displayed at a time is increased, thus improving the added value of the liquid crystal display.

In general, each pixel of a display is made up of a sub-pixel for representing red, a sub-pixel for representing green and a sub-pixel for representing blue. The respective sub-pixels are arranged in a transverse direction on a display surface. This pixel array is also termed a vertical stripe system. There is also proposed a pixel array, termed a transverse stripe system, in which the sub-pixels are arranged along the vertical direction of the display surface. In Patent Document 2, a pixel array of the transverse stripe system (FIG. 2 of Patent Document 2) is described. Referring to FIG. 2 of Patent Document 2, pixel 110 is composed of vertically arranged sub-pixels 120 of R, G and B. Scanning circuit 350, driving a plurality of scanning lines 311 for the respective sub-pixels 120, includes outputs Y1-R, Y1-G, Y1-B to Y320-R, Y320-G and Y320-B. Since the number of effective pixels of liquid crystal panel 100 in the transverse direction is 240 and that in the vertical direction is 320, scanning circuit 350 has a number of outputs equal to thrice the number 320 of the effective pixels in the vertical direction.

In Patent Document 3, another technique regarding the pixel array of the transverse stripe system (see FIGS. 2 and 3 of Patent Document 3) is described. Referring to FIGS. 2 and 3 of Patent Document 3, display pixel 10 is divided in the horizontal direction into a sub-pixel for a left eye and a sub-pixel for a right eye. In addition, the sub-pixel for the left eye and the sub-pixel for the right eye are each divided in the vertical direction into sub-pixels for R, G and B. That is, each pixel is divided into six sub-pixels. Gate line driving circuit 8, driving display pixel 10, includes outputs Y(1) to Y(1440). That is, gate line driving circuit 8 includes a number of outputs equal to three times the number 480 of pixels in the vertical direction.

The technique described in Patent Document 4 is directed to a scanning line driving circuit capable of partial representation. The technique disclosed implements the partial display function with the use of a smaller number of elements (FIG. 4 of Patent Document 4).

[Patent Document 1] JP Patent Kokai Publication No. JP-P2002-313093A (FIG. 2)
[Patent Document 2] JP Patent Kokai Publication No. JP-P2006-317566A (FIG. 2)
[Patent Document 3] JP Patent Kokai Publication No. JP-P2006-030512A (FIGS. 2 and 3)
[Patent Document 4] JP Patent Kokai Publication No. JP-P2008-140490A (FIG. 4)

SUMMARY

The entire disclosures of Patent Documents 1 to 4 are incorporated herein by reference thereto. The following analysis is given by the present invention. If a high definition display or a display with an array of pixels of the transverse stripe system is to be implemented on the basis of the technique shown in the above Patent Documents, the following problems arise.

In general, the pixel arraying pitch and the arraying pitch of the shift registers, composing a scanning circuit, are desirably equal to each other, as is apparent in consideration of layout of electrical interconnections used for transmitting output signals from the scanning circuit. The higher the resolution of a display, the smaller will become the arraying pitch of pixels and the arraying pitch of the shift registers. That is, referring to FIG. 21, circuit width L of shift register 1 will increase with decrease in the arraying pitch of pixels 21. If the pixel array is of the transverse stripe system, circuit width L is further increased because the arraying pitch of shift registers 1 is one-third of the pixel arraying pitch. With increase in L, there is raised a problem that the side of the framing of the display, on which is arranged the scanning circuit, is increased. There may also be raised a problem that circuit layout is disabled due to constraint of the manufacturing process. That is, in implementing a high definition display or a display with an array of pixels of the transverse stripe system, based on the technique disclosed in the above Patent Documents, it becomes difficult to narrow down the pitch and to narrow down the framing of the display in combination.

It is therefore an object of the present invention to provide a high definition display or a display with an array of pixels of the transverse stripe system, according to which the narrow pitch and the narrow framing of the display may be achieved in combination.

According to a first aspect of the present invention, there is provided a shift register comprising:

a first output circuit controlled by a first clock signal to output a signal to a first output signal line;

a second output circuit controlled by a second clock signal with a phase different from a phase of the first clock signal to output a signal to a second output signal line;

a first control signal line connected to the first and second output circuits; and a second control signal line connected to the first and second output circuits.

According to a second aspect of the present invention, there is provided a method for driving a shift register including a first output circuit and a second output circuit; the method comprising:

controlling the first output circuit by a first clock signal to output a signal to a first output signal line;

controlling the second output circuit by a second clock signal with a phase different from a phase of the first clock signal to output a signal to a second output signal line; and controlling the first and second output circuits by first and second control signal lines connected to the first and second output circuits.

The above shift register preferably further comprises a reset circuit activated by a third clock signal of the same period as those of the first and second clock signals, to drive the first control signal line to reset the first and second output circuits.

In the above shift register, each of the first and second output circuits preferably comprises first and second transistors;

the first transistor of the first output circuit includes a gate connected to the first control signal line, a first terminal connected to a power supply, and a second terminal connected to the first output signal line;

the second transistor of the first output circuit includes a gate connected to the second control signal line, a first terminal connected to a signal line for the first clock signal, and a second terminal connected to the first output signal line;

the first transistor of the second output circuit includes a gate connected to the first control signal line, a first terminal connected to the power supply, and a second terminal connected to the second output signal line; and the second transistor of the second output circuit includes a gate connected to the second control signal line and has a first terminal connected to a signal line for the second clock signal, and a second terminal connected to the second output signal line In the above shift register, the reset circuit preferably switches the first transistors of the first and second output circuits between a conducting state and a non-conducting state to reset the first and second output circuits.

In the above shift register, the first and second transistors are preferably either both NMOS transistors or both PMOS transistors.

There is also provided a display preferably comprising:
a pixel array that includes a plurality of pixels; and
a scanning circuit that activates the plurality of pixels by the above shift register.

In the above display, the scanning circuit preferably includes a plurality of the shift registers connected in cascade so that the first or second output signal line of a previous stage shift register delivers an input signal to the next stage shift register; and first and second output signal lines of each of the plurality of the shift registers activate the plurality of pixels.

In the above display, sub-pixels composing the plurality of pixels are preferably arranged along a scanning direction of the scanning circuit In the above method for driving a shift register, each of the first and second output circuit preferably includes first and second transistors;

the first transistor of the first output circuit includes a gate connected to the first control signal line, a first terminal connected to a power supply, and a second terminal connected to the first output signal line;

the second transistor of the first output circuit includes a gate connected to the second control signal line, a first terminal connected to a signal line for the first clock signal, and a second terminal connected to the first output signal line;

the first transistor of the second output circuit includes a gate connected to the first control signal line, a first terminal connected to the power supply, and a second terminal connected to the second output signal line; and the second transistor of the second output circuit includes a gate connected to the second control signal line, a first terminal connected to a signal line for the second clock signal, and a second terminal connected to the second output signal line.

The above method for driving a shift register preferably further comprises: driving the first control signal line by a third clock signal with the same period as those of the first and second clock signals to switch the first transistors of the first and second output circuits between a conducting state and a non-conducting state.

The above method for driving a shift register preferably further comprises:

driving the first control signal line during a first clock period to switch the first transistors of the first and second output circuits from a conducting/non-conducting state to a non-conducting/conducting state;

outputting the first clock signal from the first output circuit during a second clock period;

outputting the second clock signal from the second output circuit during a third clock period; and driving the first control signal line by the third clock signal during an Nth clock period, N being an integer not smaller than 4, to switch the first transistors of the first and second output circuits from a non-conducting/conducting state to a conducting/non-conducting state In the above method for driving a shift register, a phase of the first and second clock signals for the first clock period is preferably the same with that for the Nth clock period.

The meritorious effects of the present invention are summarized as follows.

The shift register according to the present invention includes two or more output circuits. In addition, first and second control signal lines may be connected in common for the total of the output circuits. Hence, the circuitry that controls the output circuits may be provided in common for the output circuits, such as to reduce the total number of the transistors that compose the shift register, thereby enabling a narrow pitch of the scanning circuit and a narrow framing.

The shift register according to the present invention includes two or more output circuits, so that it is able to drive a plurality of gate bus lines from a single circuit. It is thus possible to achieve a narrow pitch and a narrow framing in combination.

The shift register of the present invention includes a reset circuit that is activated with the period of the clock signal to set a transistor (first transistor), to the gate of which is connected the first control signal line, to a non-conducting (off) state. This reset circuit is deactivated during the time period when the first transistor is to be turned on. It is thus possible to prevent the first transistor from being turned off, by the operation of the reset circuit, during the time period when the first transistor is to be turned on.

The shift register according to the present invention may be composed only of NMOS transistors or only of PMOS transistors. Hence, a shift register may be manufactured at a low cost.

A display according to the present invention includes an array of a multiplicity of pixels and a scanning circuit for activating the pixels. This scanning circuit is constituted by the shift register of the present invention. It is thus possible to implement a display having high resolution pixels.

The number of output circuits, associated with the shift register of the present invention, may be set by setting the phases or the number of the phases of the clock signal.

BRIEF DESCRIPTIONS OF THE DRAWINGS

PREFERRED MODES

Figure 1:
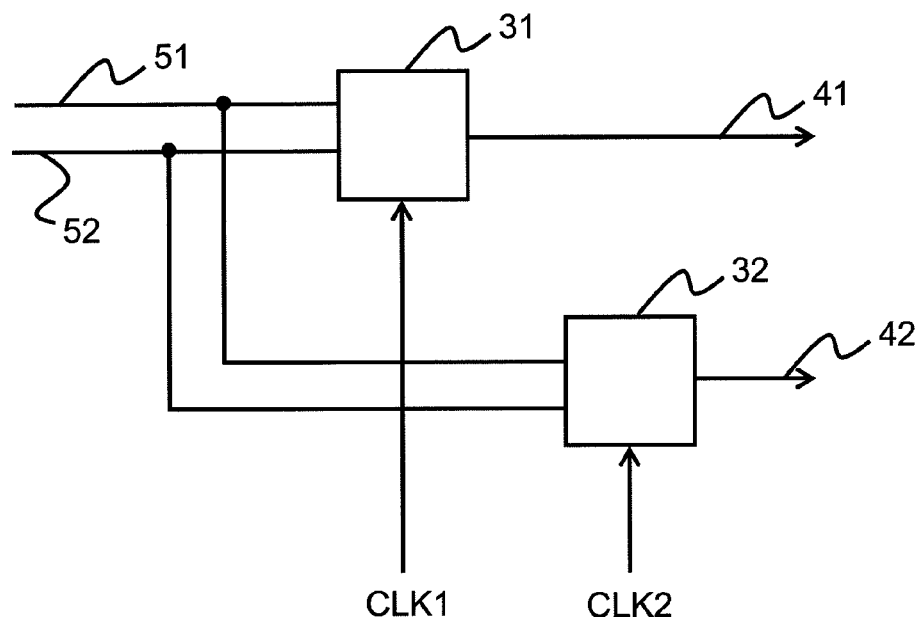
FIG. 1 is a block diagram showing a part of a structure of the shift register according to an exemplary embodiment of the present invention.

The shift register according to an exemplary embodiment of the present invention is now explained with reference to the drawings. FIG. 1 depicts a block diagram showing a portion of the setup of the shift register of the present exemplary embodiment. Referring to FIG. 1, the shift register includes first output circuit 31, second output circuit 32, first signal line 51 and second control signal lime 52.

First output circuit 31 is controlled by first clock signal CLK1 to output a signal on first output signal line 41. Second output circuit 32 is controlled by second clock signal CLK2 of a phase different from the phase of first clock signal CLK1 to output a signal on second output signal line 42. First and second signal lines 51, 52 are connected to first and second output circuits 31, 32.

First Example

[Explanation of Structure]

Figure 2:
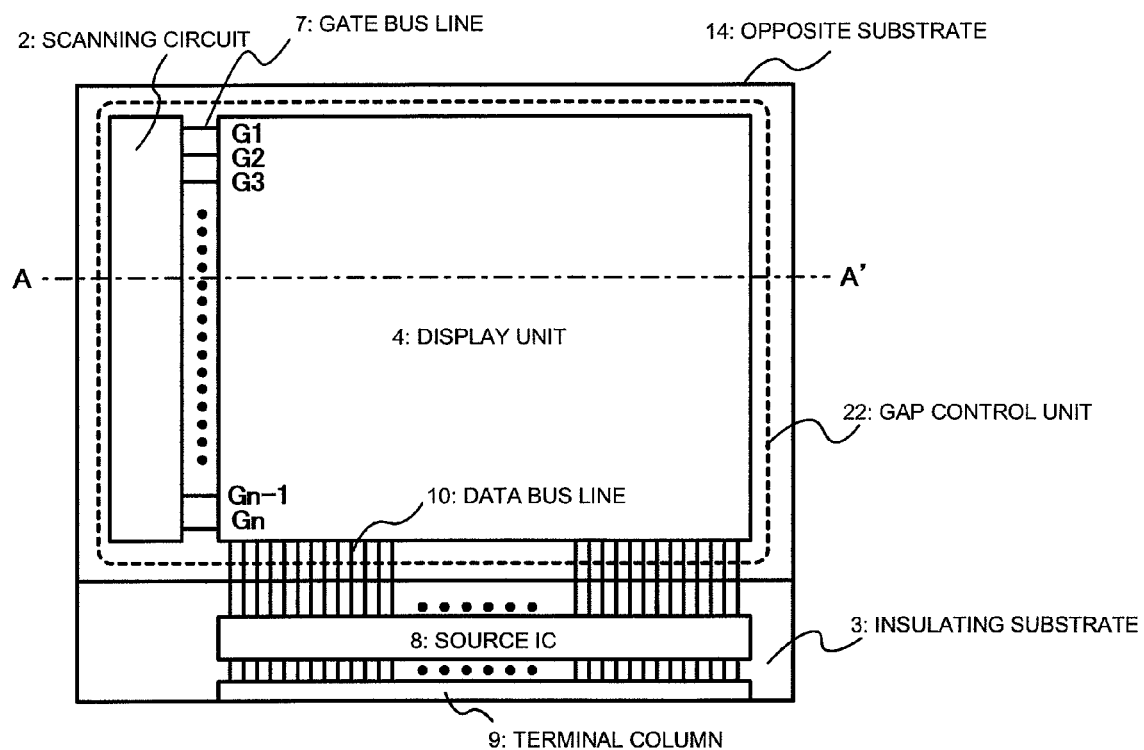
FIG. 2 is a circuit diagram showing a display of a first example.
Figure 3:
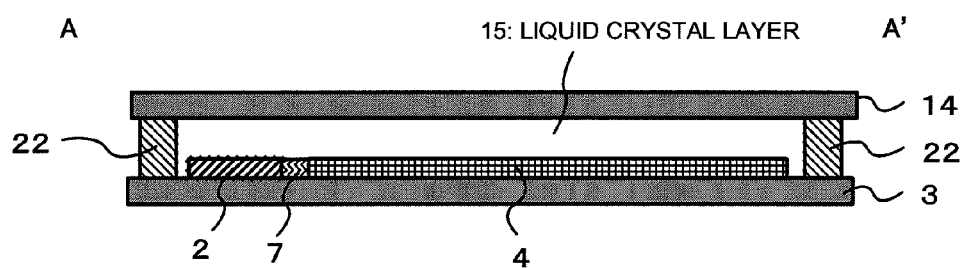
FIG. 3 is a cross-sectional view of the display of the first example.
Figure 4:
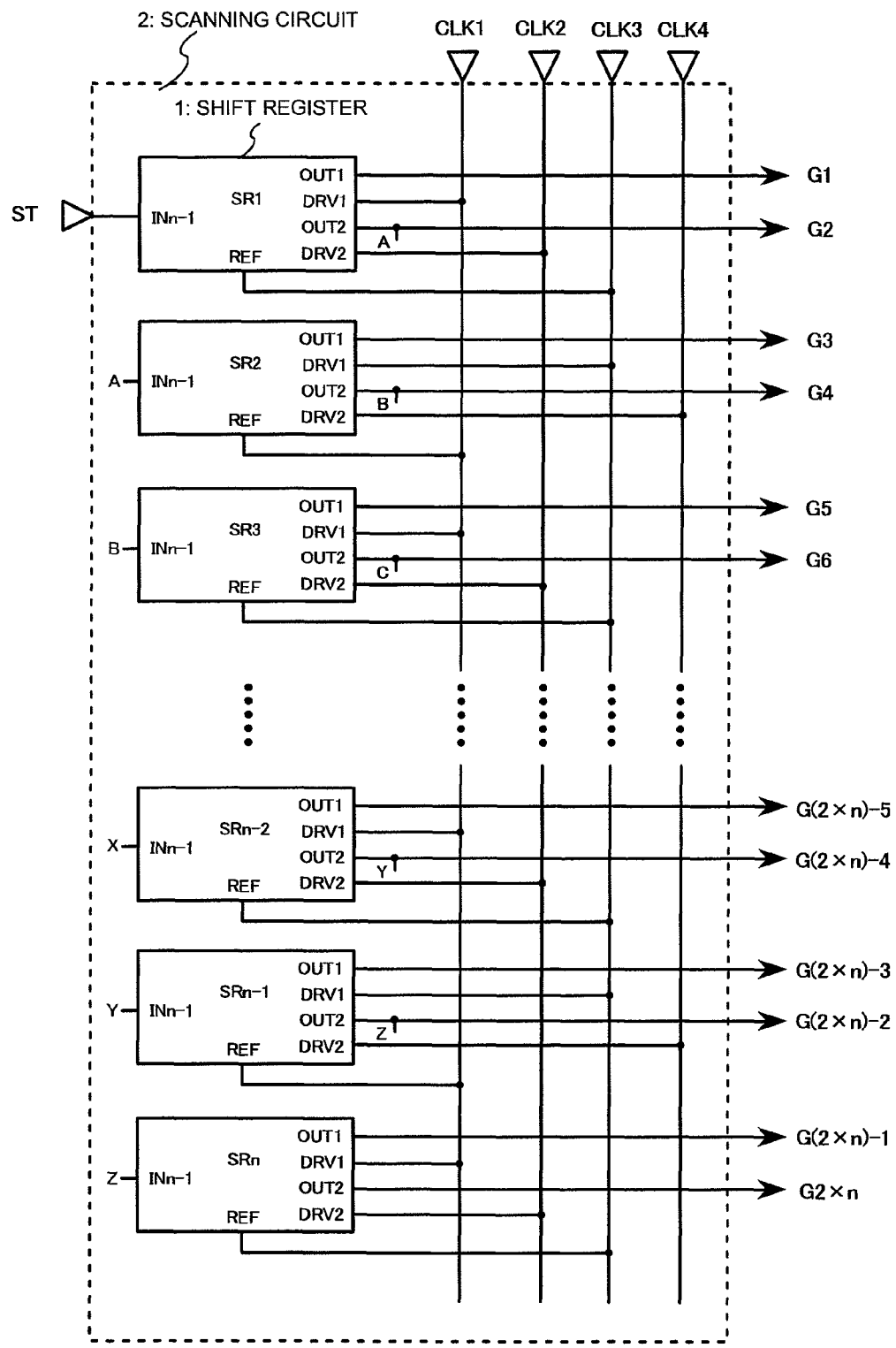
FIG. 4 is a block diagram showing a structure of a scanning circuit of the first example.
Figure 5A:
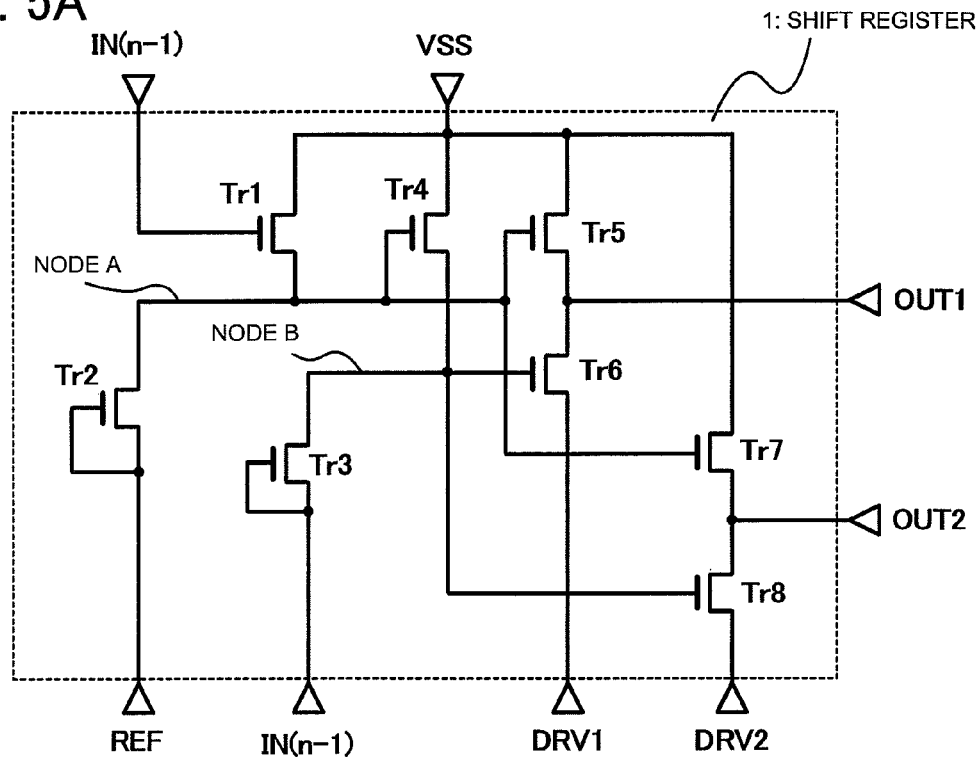
FIGS. 5A and 5B are circuit diagrams showing configurations of the shift register of the first example.
Figure 5B:
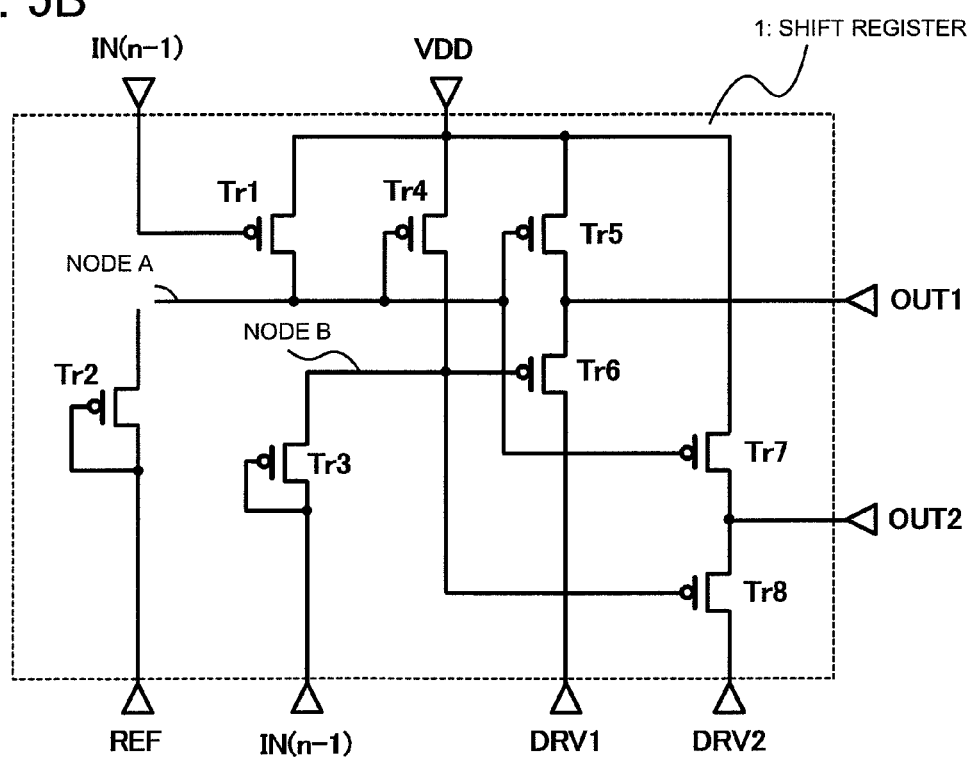

A shift register according to a first example of the present invention is now described with reference to the drawings. FIG. 2 depicts a plan view showing a display according to the present example. FIG. 3 depicts a cross-sectional view of the display according to the present example and FIG. 4 depicts a structure of a scanning circuit of the present example. FIGS. 5A and 5B each depict a block diagram of a shift register of the present example and FIGS. 6A and 6B each depict a pixel part of the display according to the present example.

Figure 6A:
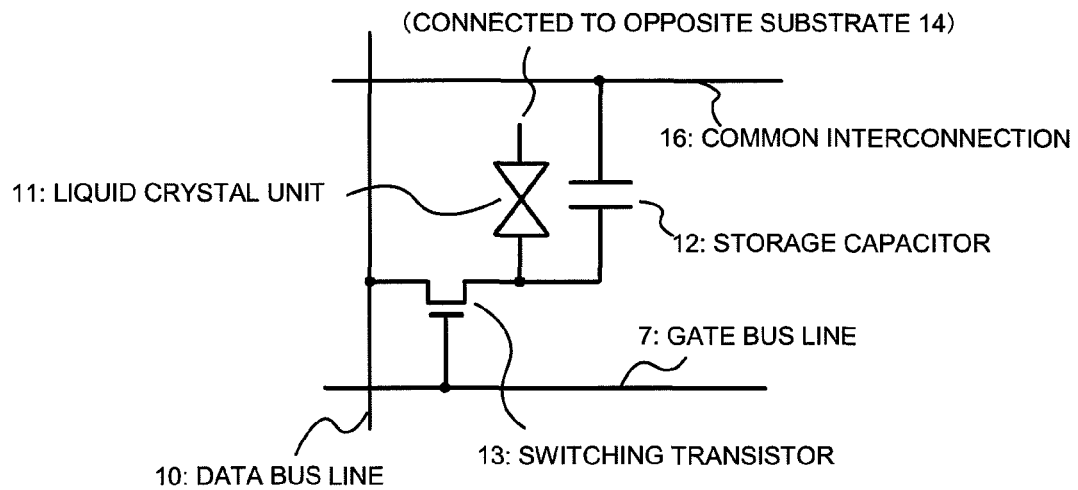
FIGS. 6A and 6B are circuit diagrams showing pixel parts of the display of the first example.
Figure 6B:
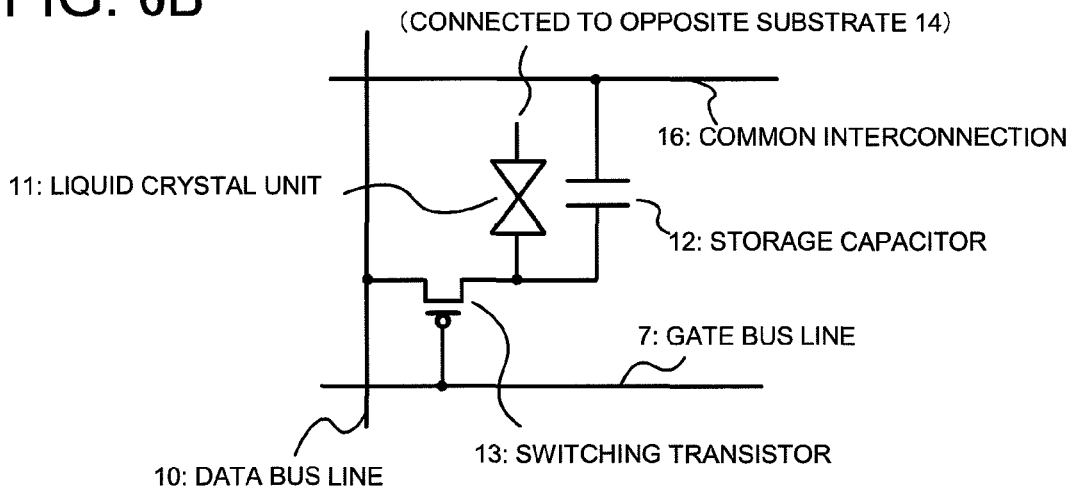

Referring to FIG. 2, the display includes, on an insulating substrate, formed as a transparent glass substrate, display unit 4, scanning circuit 2, gate but lines G1, G2, G3, ..., Gn–1, Gn, source IC 8, terminal column 9, data bus lines 10, opposite substrate 14 and gap control unit 22. Display unit 4 includes a multiplicity of pixels, each of which is shown in FIGS. 6A and 6B.

FIG. 3 depicts a cross-sectional view of the display taken along line A-A' of FIG. 2. Referring to FIG. 3, liquid crystal layer 15 is held in a space defined by insulating substrate 3, opposite substrate 14 and by gap controlling unit 22.

Referring to FIG. 4, scanning circuit 2 includes a plurality of shift registers 1 (SR1, SR2, SR3, ..., SRn–1, SRn) and a set of signal lines CLK1 to CLK4 and ST). Signal line ST in FIG. 4 represents a terminal on which a start signal is entered and which is connected to terminal IN(n–1) of shift register 1 (SR1). Gate bus lines G1 to G2n are connected to terminal OUT1 or OUT2 of respective shift registers 1 of scanning circuit 2. Terminal OUT2 of SR1 is connected via A of FIG. 4 to gate bus line G2 and to terminal IN(n–1) of SR2.

Referring to FIG. 5A, shift register 1 of the present example includes NMOS transistors Tr1 to Tr8 and terminals IN(n–1), DRV1, DRV2, REF, OUT1, OUT2 and VSS. Terminal IN(n–1) receives start signal ST or a signal from terminal OUT2 of neighboring shift register 1. Referring to FIG. 4, terminals DRV1, DRV2 and REF receive clock signals CLK1, CLK2, CLK3 or CLK4. Output terminals OUT1, OUT2 output signals at the HIGH level or at the LOW level, depending on the operation of shift register 1. A constant voltage equivalent to a LOW signal is delivered to terminal VSS. Node A (first control signal line) is connected to the gates of transistors Tr5 and Tr7, while node B (second control signal line) is connected to the gates of transistors Tr6 and Tr8.

FIG. 5B shows an alternative structure of shift register 1 of the present example, that is, the structure by a set of PMOS transistors. The alternative structure of shift register 1 of the present example includes PMOS transistors Tr1 to Tr8 and terminals IN(n–1), DRV1, DRV2, REF, OUT1, OUT2 and VDD. It is observed that terminal IN(n–1) receives the start signal ST or a signal from terminal OUT2 of neighboring shift register 1. Referring to FIG. 4, terminals DRV1, DRV2 and REF receive clock signals CLK1, CLK2, CLK3 or CLK4. Terminals OUT1 and OUT2 output a HIGH signal or a LOW signal, depending on the operation of shift register 1, and gate bus lines Gi (i=1 to 2n) receive the output signals. A constant voltage equivalent to a HIGH signal is applied to terminal VDD. Nodes A and B of FIG. 5B are equivalent to nodes A and B shown in FIG. 5A.

Referring to FIGS. 5A and 5B, the output circuit, formed by transistors Tr5 and Tr6 (first output circuit), and the output circuit, formed by transistors Tr7 and Tr8 (second output circuit), are provided in shift register 1. Nodes A and B are connected in common to these two output circuits. The source or drain terminal of transistor Tr6 is connected to DRV1, while the source or drain terminal of transistor Tr8 is connected to DRV2. It is observed that different ones of signal lines for clock signals CLK1 to CLK4 are connected to terminals DRV1 and DRV2, so that output signals, controlled by different ones of the clock signals, are output from one and the same shift register 1 to terminals OUT1 and OUT2. By this structure, the number of the transistors that go to make up a single shift register may be made drastically smaller than with a conventional structure of two shift registers connected parallel to each other.

Referring to FIG. 6A, each pixel includes switching transistor 13, liquid crystal unit 11, storage capacitor 12, data bus line 10, gate bus line 7 and common signal line 16. Switching transistor 13 is formed by an NMOS transistor to the gate of which is connected gate bus line 7 and to the source of which is connected data bus line 10. To the drain of the switching transistor, there are connected electrodes of liquid crystal unit 11 and storage capacitor 12. The other electrode of storage capacitor 12 is connected to common signal line 16. FIG. 6B shows the structure of a pixel when switching transistor 13 is a PMOS transistor.

Referring to FIG. 2, source IC 8 receives a data signal for image display, received from an external connection device, not shown, via terminal column 9, to deliver the so received signal to data bus line 10. Source IC 8 is a transistor circuit chip that is formed on a substrate different from insulating substrate 3 and that is COG (Chip On Glass) mounted on insulating substrate 3.

[Explanation of Operation]

Figure 7A:
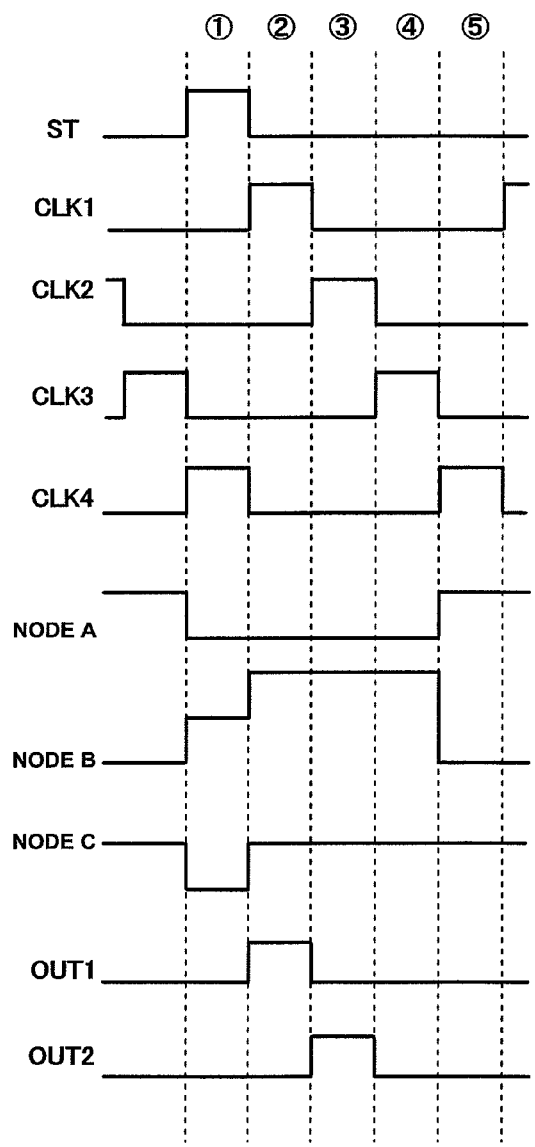
FIGS. 7A and 7B are timing charts showing an operation of the shift register of the first example.
Figure 7B:
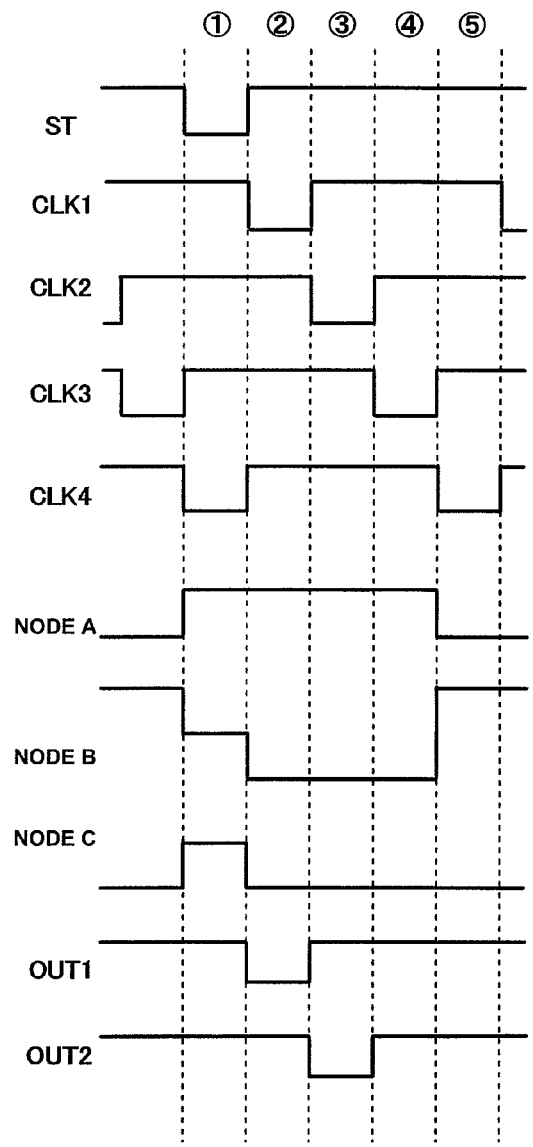

FIGS. 7A and 7B depict a timing chart showing an operation of the shift register of the present example. It is observed that the timing chart, shown in FIG. 7A, is for the case where shift register 1 is formulated as shown in FIG. 5A. Reference is first made to FIG. 7A by way of explaining the operation of the present example.

During the time period 1 of FIG. 7A, start signal ST transitions from the LOW level to the HIGH level. If the HIGH level of start signal ST is applied to terminal IN(n−1) of shift register 1 (SR1), transistor Tr1 is turned on, so that node A is brought LOW. Since transistor Tr3 is turned on at this time simultaneously, node B is set to the HIGH level (in actuality, a voltage corresponding to the HIGH level potential less the threshold voltage of transistor Tr3).

If, during the time period 2, start signal ST goes LOW, both transistors Tr1 and Tr3 are turned off. With transistor Tr3 turned off, the node B is in the floating state. If, in this state, clock signal CLK1, coupled to terminal DRV1, transitions from the LOW level to the HIGH level, the potential of node B rises to a potential higher than the HIGH level due to the bootstrap effect. Hence, a gate voltage equal to or higher than the HIGH level is applied to each of the gates of transistors Tr6 and Tr8. At this time, the HIGH level of clock signal CLK1 is output via transistor Tr6 to terminal OUT1 without being lowered in potential level. Since terminal OUT1 is connected to gate bus line G1, the potential on G1 also goes HIGH.

If, during the time period 3, clock signal CLK1 transitions from the HIGH level to the LOW level, terminal OUT1 is also set to the LOW level. Since clock signal CLK2 transitions from the LOW level to the HIGH level, node B is set to a potential higher than the HIGH level. Thus, the HIGH level is transferred via transistor Tr8 to terminal OUT2 without being lowered in potential. Since the signal at terminal OUT2 is connected to gate bus line G2, the potential on G2 also is brought HIGH.

During the time period 4, clock signal CLK3 goes HIGH. Since clock signal CLK3 is connected to terminal REF, transistor Tr2 is in on-state. Hence, node A is set to a HIGH level (in actuality, a potential lower than the HIGH level potential by a threshold voltage of transistor Tr2). Hence, transistors Tr5 and Tr7 are both turned on, with terminals OUT1 and OUT2 going LOW. On the other hand, transistor Tr4 is turned on, and hence node B is in a LOW level. This turns transistors Tr6 and Tr8 off, thus electrically isolating terminals DRV1, DRV2 from terminals OUT1, OUT2, respectively.

The operation of shift register 1 (SR2) is now explained. The signal at terminal OUT2, output by shift register 1 (SR1) during the time period 3, is branched and transmitted via A of FIG. 4 to terminal IN(n−1) of shift register 1 (SR2). Thus, at this timing, transistors Tr1 and Tr3 of shift register 1 (SR2) are both turned on. Hence, the operation of shift register 1 (SR2) that then occurs is similar to that of shift register 1 (SR1) described above. During the time period 4, the HIGH level of clock signal CLK3 is output to terminal OUT1 without being lowered in potential. Terminal OUT1 is connected to gate bus line G3, and hence goes HIGH in a manner similar to G1 and G2 described above. That is, the shift registers downstream of shift register 1 (SR2) effect the driving of gate bus lines Gi (i=1 to 2n) and operation transfer to the next stage shift registers 1, using the signal on terminal OUT2 of the previous stage as trigger. This operation is reiterated up to shift register 1 (SRn).

In the above-described operation of shift register 1, when one of gate bus lines 7 has transitioned to the HIGH level, switching transistors 13 in pixels 21 connected to gate bus line 7 in question, out of the pixels of display unit 4 shown in FIG. 2, are all in on-states. On the other hand, video signals, output from an external connection device, not shown, are transmitted via terminal column 9 and source IC 8 to data bus line 10. In this state, the video signals, transmitted via the associated data bus line 10, are delivered to the set of the pixels activated as described above. Switching transistors 13 transmit input video signal voltages to storage capacitors 12 and to liquid crystal units 11 to control the transmittance of the light source, not shown. By selecting the total of gate bus lines G1 to Gn within one frame period, and by transmitting the video signals, associated with the pixels connected to respective gate bus lines Gi (i=1 to n), to the respective pixels, the display state of the total of the pixels may be changed within one frame period. Thus, by changing over the display state once every frame period, display unit 4 is able to fulfill its function as the display.

In the foregoing, the method of driving shift register 1, formed by a set of NMOS transistors, and pixel 21, has been described. If the shift register is formed by a set of PMOS transistors, which are turned on and off by the LOW level signal and the HIGH level signal, respectively, the operation is such a one shown in FIG. 7B. Thus, the basic operation is similar to that of shift register 1, formed by the NMOS transistors, shown in FIG. 5A, despite the difference in polarities. As regards the driving of pixel 21, the basic operation is the same even when the shift register is formed by the set of PMOS transistors, except that switching transistor 13 is turned on when gate bus line 7 is brought LOW. That is, the display of the present example is able to perform its display function even in case the shift register is formed by the set of PMOS transistors.

In this manner, the display of the present example includes display unit 4 and scanning circuit 2, which scanning circuit 2 includes a plurality of shift registers 1. Each shift register 1 includes an output circuit made up of transistors Tr5 and Tr6, and another output circuit made up of transistors Tr7 and Tr8, totaling at two output circuits. Hence, two gate bus lines Gi (i=1 to 2n) may be run in operation from a sole circuit. Thus, transistors Tr1 to Tr4, other than the transistors of the output circuits, may be used as a common circuit for the two output circuits, with the result that the number of the transistors that make up shift register 1 may be reduced. It is thus possible to avoid the problem that the framing length of the display (corresponding to the transverse length in FIGS. 5A and 5B) becomes larger despite the fact that the pixel pitch or the vertical length of shift register 1 in FIGS. 5A and 5B has been decreased as a result of the resolution of display unit 4 becoming higher.

Moreover, with shift register 1 of the present example, node A may be set at an optional potential every clock period. If, on node A, potential variations are produced due to leakage currents at transistors Tr1, Tr2 or to the noise from outside, to turn off transistor Tr4, node B is in the floating state. Transistors Tr6 or Tr8 is turned on under effect of the clock signal coupled to terminals DRV1 or DRV2. This may cause the clock signal to be delivered to terminals OUT1 or OUT2 to lead to a malfunction that shift register 1 delivers an output signal at a timing no output signal inherently should be delivered. In the present example, in which node A is set to maintain transistors Tr5 and Tr7 in the off-state every clock period, as described above, it is possible to prevent the malfunction of the circuit otherwise caused by potential variations on node A.

Second Example

[Explanation of Structure]

Figure 8:
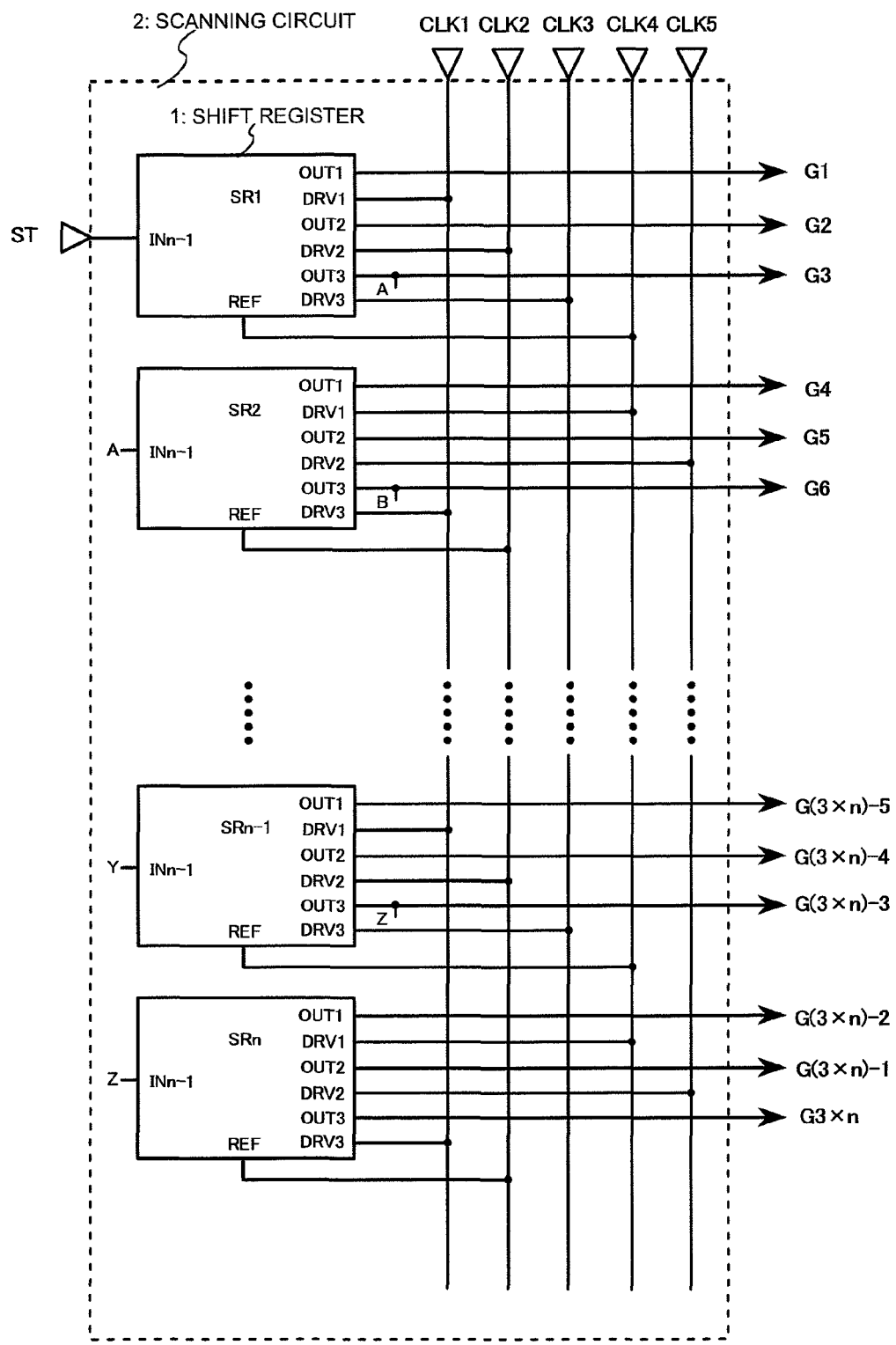
FIG. 8 is a block diagram showing a structure of a scanning circuit of a second example.
Figure 9A:
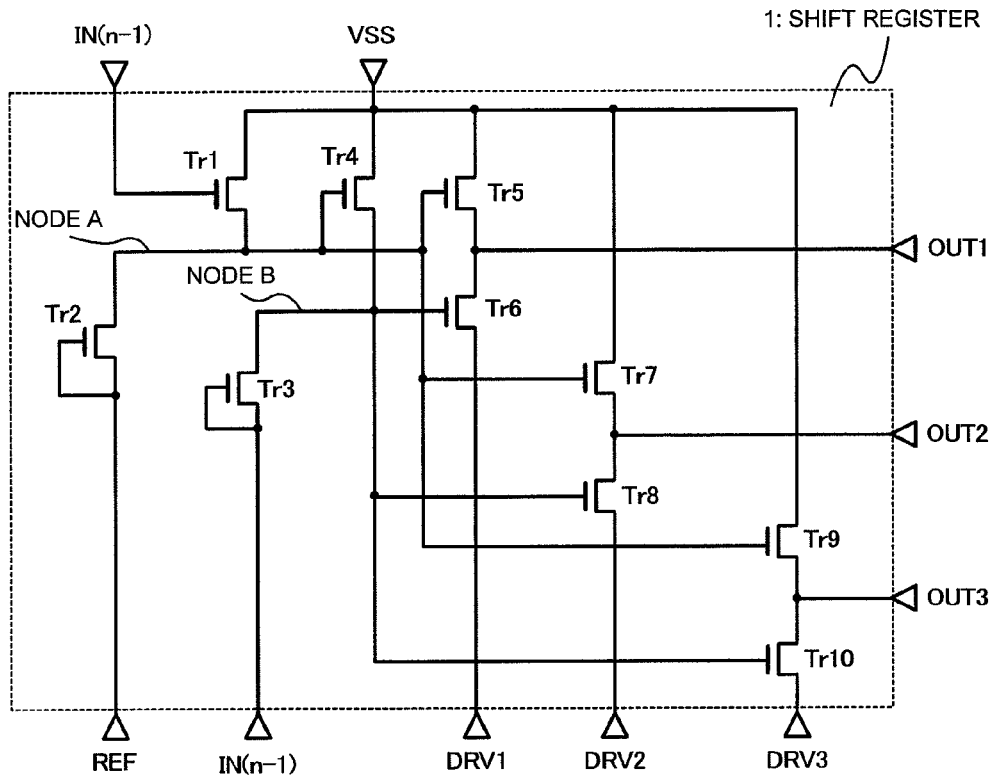
FIGS. 9A and 9B are circuit diagrams showing configurations of the shift register of FIG. 8.
Figure 9B:
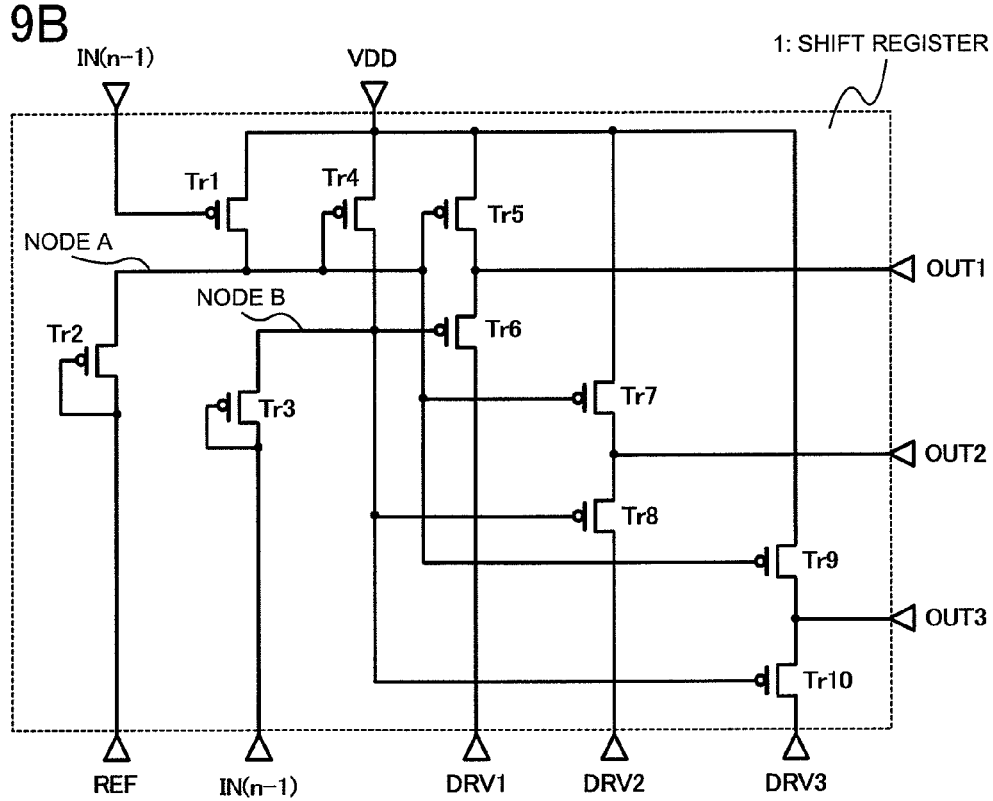

A second example of the present invention is now described with reference to the drawings. FIG. 8 depicts a block diagram showing the structure of the scanning circuit of the present example, and FIGS. 9A and 9B depict circuit diagrams showing the structure of its shift register. The display of the present example is similar to that of the first example (FIG. 2). The cross-sectional view of the display, shown in FIG. 3, is also similar to that of the first example.

The present example differs from the first example as to the structure of scanning circuit 2 in FIG. 2 and as to the structure of shift register 1 composing scanning circuit 2. Referring to FIGS. 8, 9A and 9B, scanning circuit 2 and shift register 1 are now explained. Referring to FIG. 8, scanning circuit 2 includes a plurality of shift registers (SR1, SR2, . . . , SRn−1, SRn) and a set of signal lines (clock signals CLK1 to CLK5 and ST). Gate bus lines Gi (i=1 to 3n) are connected to one of three terminals, namely OUT1, OUT2 and OUT3, of each of shift registers 1 of scanning circuit 2. Output signals of three terminals OUT1, OUT2 and OUT3 are transmitted to gate bus lines Gi (i=1 to 3n) to which are connected the respective terminals.

Referring to FIG. 9A, shift register 1 of the present example includes NMOS transistors Tr1 to Tr10, terminal IN(n−1), DRV1, DRV2, DRV3, REF, OUT1, OUT2, OUT3 and VSS. Shift register 1 of the present example differs from shift register 1 shown in FIG. 5A in including a DRV terminal DRV3 in addition to terminals DRV1 and DRV2, and in including terminal OUT3 in addition to terminals OUT1 and OUT2. That is, shift register 1 of the present example is configured to deliver three output signals from single shift register 1. It is observed that terminal IN(n−1) receives start signal ST or the signal output from terminal OUT3 of neighboring shift register 1. Referring to FIG. 8, terminals DRV1, DRV2, DRV3 and REF receive clock signals CLK1, CLK2, CLK3, CLK4 or CLK5. Terminals OUT1, OUT2 and OUT3 output a HIGH signal or a LOW signal, depending on the operation of shift register 1, and gate bus lines Gi (i=1 to 3n) receive the output signals. A constant voltage equivalent to the LOW signal is applied to the VSS terminal.

FIG. 9B shows an alternative structure of shift register 1 of the present example, that is, the structure by a set of PMOS transistors.

The alternative structure of shift register 1 of the present example includes PMOS transistors Tr1 to Tr10 and terminals IN(n−1), DRV1, DRV2, DRV3, REF, OUT1, OUT2, OUT3 and VDD. Terminal IN(n−1) receives a signal from terminal OUT3 of neighboring shift register 1. Terminals DRV1, DRV2, DRV3 and REF receive clock signals CLK1, CLK2, CLK3, CLK4 or CLK5. Terminals OUT1, OUT2 and OUT3 output a HIGH signal or a LOW signal, depending on the operation of shift register 1, and gate bus lines Gi (i=1 to 3n) receive the output signals. A constant voltage equivalent to a HIGH signal is applied to terminal VDD.

In the present example, each shift register includes three output circuits. Alternatively, the shift register may be provided with four or more shift registers. In this case, the numbers of the DRV terminals and output terminals OUT are increased in keeping with the number of the output circuits. Thus, a plurality of output signals may be generated by increasing the number of the clock signals.

[Explanation of Operation]

Figure 10A:
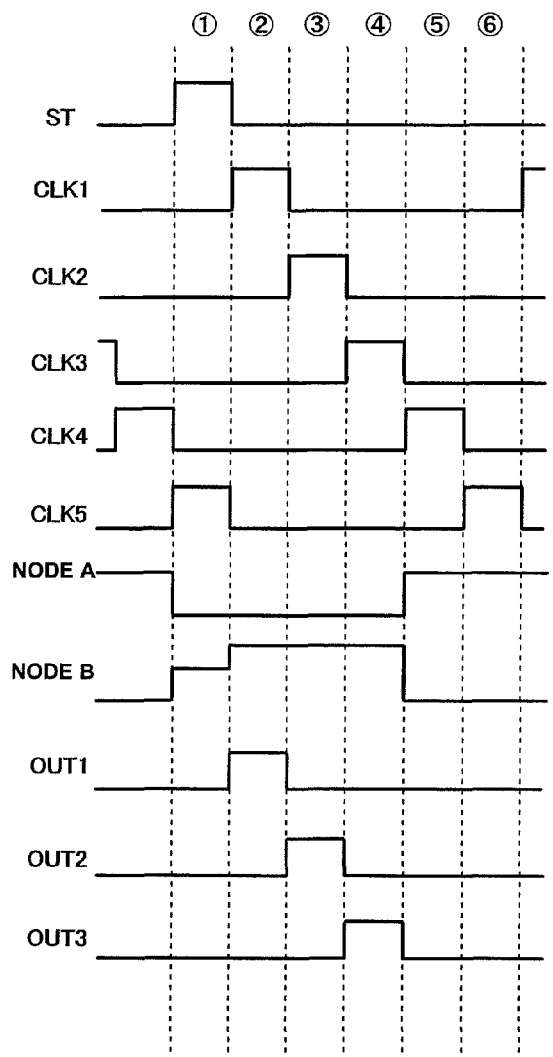
FIGS. 10A and 10B are timing charts showing an operation of the shift register of the second example.
Figure 10B:
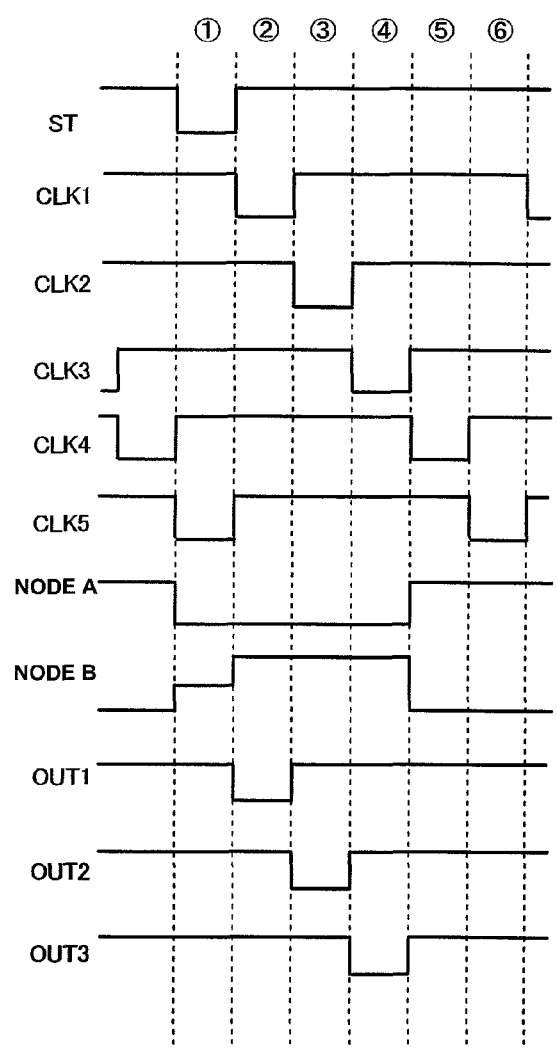

FIGS. 10A and 10B depict timing charts showing the operation of the present example. FIG. 10A depicts a timing chart for a case where shift register 1 is configured as shown in FIG. 9A. Referring first to FIG. 10A, the operation of shift register 1 of the present example is explained.

During the time period 1 of FIG. 10A, start signal ST transfers from the LOW level to the HIGH level. If the HIGH level of start signal ST is applied to terminal IN(n−1) of shift register 1 (SR1), transistor Tr1 is turned on, so that node A goes LOW. Since transistor Tr3 is turned on simultaneously, at this time, node B is set to the HIGH level (in actuality, to a voltage corresponding to the HIGH level potential less the threshold voltage of transistor Tr3).

If, during the time period 2, start signal ST transfers to the LOW level, both transistors Tr1 and Tr3 are turned off. With transistor Tr3 turned off, node B is in the floating state. If, in this state, clock signal CLK1 coupled to terminal DRV1 transitions from the LOW level to the HIGH level, the potential of node B rises to a potential higher than the HIGH level due to the bootstrap effect. Hence, a gate voltage equal to or higher than the HIGH level is applied to each of the gates of transistors Tr6, Tr8 and Tr10. Hence, the HIGH level of clock signal CLK1 is output via transistor Tr6 to terminal OUT1 without being lowered in potential level. Since terminal OUT1 is connected to gate bus line G1, the potential on G1 also goes HIGH.

If, during the next time period t3, clock signal CLK1 transitions from the HIGH level to the LOW level, terminal OUT1 and gate bus line G1 are also set to the LOW level. Since clock signal CLK2 transitions from the LOW level to the HIGH level, node B is set to a potential higher than the HIGH level. Thus, the HIGH level on clock signal CLK2 is transferred via transistor Tr8 to terminal OUT2 without being lowered in potential. Since the signal at terminal OUT2 is connected to gate bus line G2, the potential on G2 also goes HIGH.

If, during the next time period t4, clock signal CLK2 transitions from the HIGH level to the LOW level, terminal OUT2 and gate bus line G3 are also set to LOW. Since clock signal CLK3 transitions from the LOW level to the HIGH level, node B is set to a potential higher than the HIGH level. Thus, the HIGH level is transferred via transistor Tr10 to terminal OUT3 without being lowered in potential. Since the signal at terminal OUT3 is connected to gate bus line G3, the potential on G3 also goes HIGH.

During the next time period 5, clock signal CLK4 transitions from the LOW level to the HIGH level. Transistor Tr2, connected to terminal REF, is turned on, and node A is set to a HIGH level (in actuality, to a potential lower than the HIGH level potential by a threshold voltage of transistor Tr2). Hence, transistors Tr5, Tr7 and Tr9 are all turned on, with terminals OUT1, OUT2 and OUT3 going LOW. On the other hand, transistor Tr4 is in on-state, and hence node B is in a LOW level. This turns transistors Tr6, Tr8 and Tr10 off, thus electrically isolating terminals DRV1, DRV2 and DRV3 from terminals OUT1, OUT2 and OUT3, respectively.

The operation of shift register 1 (SR2) is now explained. The signal at terminal OUT3, output by shift register 1 (SR1) during the time period 4, is branched and transmitted via A of FIG. 8 to terminal IN(n−1) of shift register 1 (SR2). Thus, transistors Tr1 and Tr3 of shift register 1 (SR2) are both in on-states, and hence shift register 1 (SR2) operates similarly to shift register 1 (SR1) described above. During the time period 5, the HIGH level of clock signal CLK4 is output to terminal OUT1 without being lowered in potential. Terminal OUT1 is connected to gate bus line G4, and hence goes HIGH as on lines G1, G2 and G3 described above. In this manner, the shift registers downstream of shift register 1 (SR2) effect the driving of gate bus lines Gi (i=1 to 3n) and operation transfer to the next stage shift registers 1, using the signal on OUT3 of the previous stage as trigger. This operation is reiterated up to shift register 1 (SRn).

In the above-described operation of shift register 1, when one of gate bus lines 7 has transitioned to the HIGH level, the switching transistors 13 in pixels 21, connected to gate bus line 7 in question, out of the pixels of display unit 4 shown in FIG. 2, are all in on-states. On the other hand, video signals, output from an external connection device, not shown, are transmitted via terminal column 9 and source IC 8 to data bus line 10. In this state, the video signals, transmitted via the associated data bus line 10, are delivered to the activated pixels. Switching transistors 13 transmit input video signal voltages to storage capacitors 12 and to liquid crystal units 11 to control the transmittance of the light source, not shown. By selecting the total of gate bus lines G1 to Gn within one frame period, and by transmitting the video signals, associated with the pixels connected to the respective gate bus lines Gi (i=1 to n), to the respective pixels, the display state of the total of the pixels may be changed within one frame period. Thus, by changing over the display state once every frame period, display unit 4 is able to fulfill its function as the display.

In the foregoing, the method of driving shift register 1, formed by a set of NMOS transistors, and pixel 21, has been described. If the shift register is formed by a set of PMOS transistors, the operation is such a one shown in FIG. 10B. The PMOS transistors are turned on and off by the LOW level signal and the HIGH level signal, respectively. Thus, the basic operation is similar to that of shift register 1 of FIG. 9A, formed by the NMOS transistors, despite the difference in voltage polarities. As regards the driving of pixel 21, the basic operation is the same as that when the shift register is formed by the set of NMOS transistors, except that switching transistor 13 is turned on when gate bus line 7 goes LOW. That is, the display of the present example is able to perform its display function even when the shift register is formed by the set of PMOS transistors.

In this manner, the display of the present example includes display unit 4 and scanning circuit 2, which scanning circuit 2, provided adjacent to the display unit, includes a plurality of shift registers 1. Each shift register 1 includes an output circuit made up of transistors Tr5 and Tr6, another output circuit made up of transistors Tr7 and Tr8 and yet another output circuit made up of transistors Tr9 and Tr10, totaling at three output circuits. Hence, three gate bus lines Gi (i=1 to 3n) may be run in operation from a sole circuit. That is, TFTs Tr1 to Tr4, other than TFTs of the output circuits, may be used as a common circuit for the three output circuits, thus allowing reducing the number of the transistors composing shift register 1. The reducing effect in the present example is higher than that of the first example. It is thus possible to avoid the problem that the length of the framing of the display (corresponding to the transverse length in FIGS. 9A and 9B) becomes larger despite the fact that the pixel pitch or the vertical length of shift register 1 in FIGS. 9A and 9B is decreased as a result of the resolution of display unit 4 becoming higher.

With shift register 1 of the present example, as with the the first example, node A is set to an optional potential for every clock period, so that it is possible to suppress potential variations due to transistor leakage or noise. It is thus possible to provide a scanning circuit in which circuit malfunctions, otherwise brought about by potential variations or the noise, may be inhibited, and a display that makes use of the scanning device.

Third Example

[Explanation of Structure]

Figure 11A:
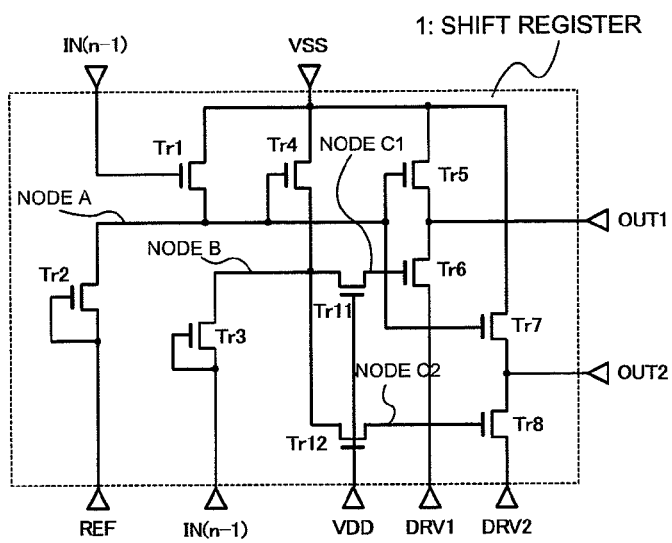
FIGS. 11A to 11C are circuit diagrams showing a configuration of the shift register of a third example.
Figure 11B:
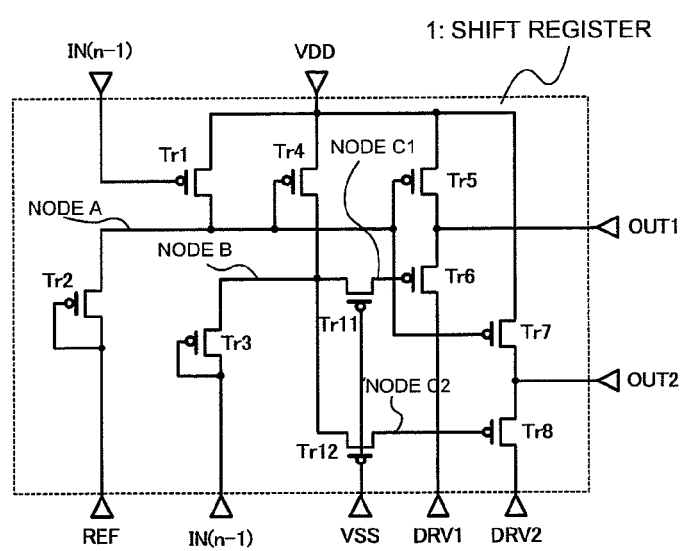
Figure 11C:
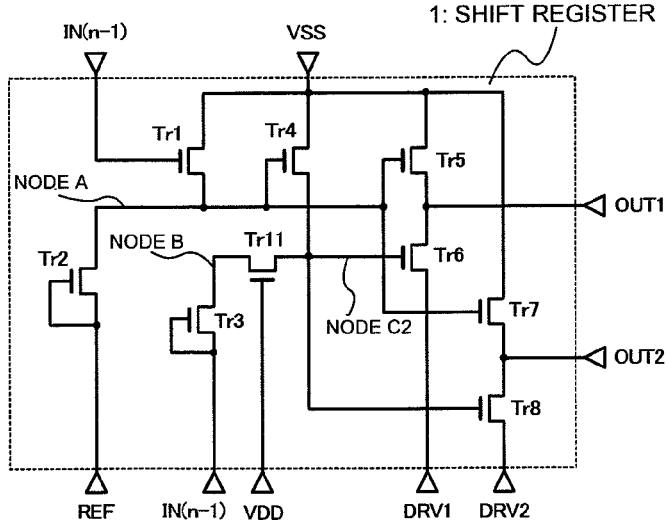
Figure 12A:
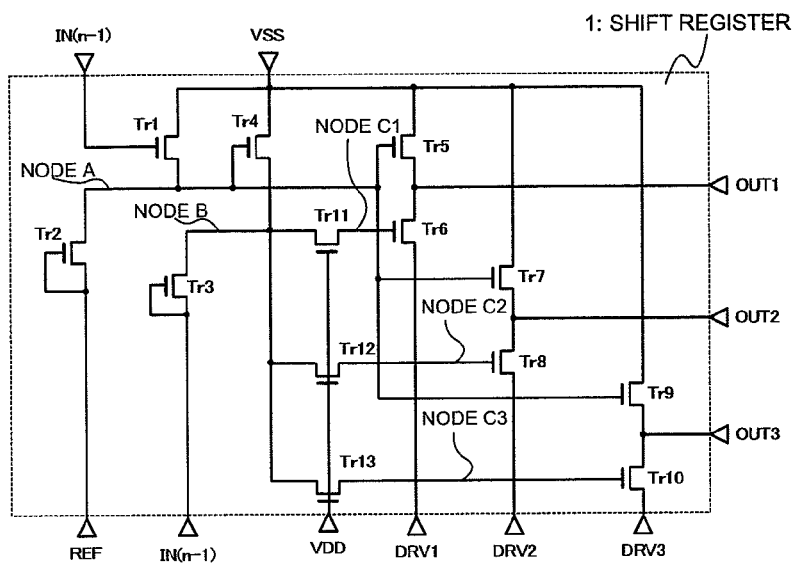
FIGS. 12A to 12C are circuit diagrams showing an alternative configuration of the shift register of the third example.
Figure 12B:
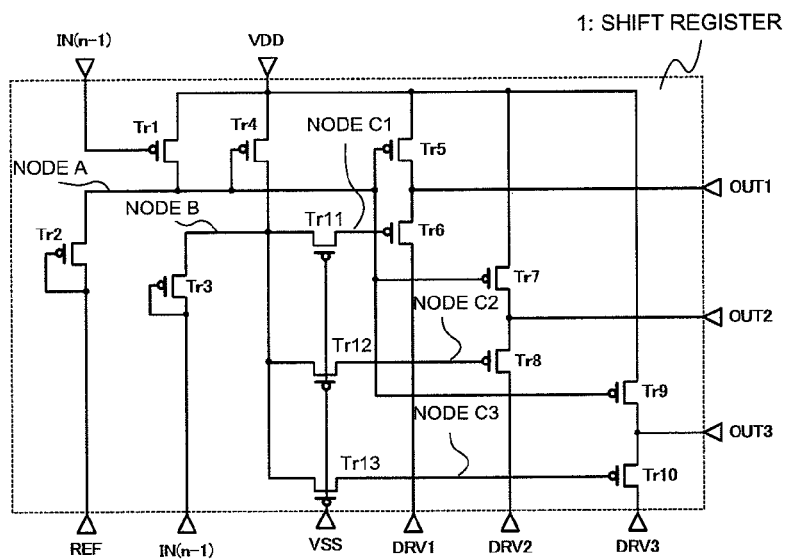
Figure 12C:
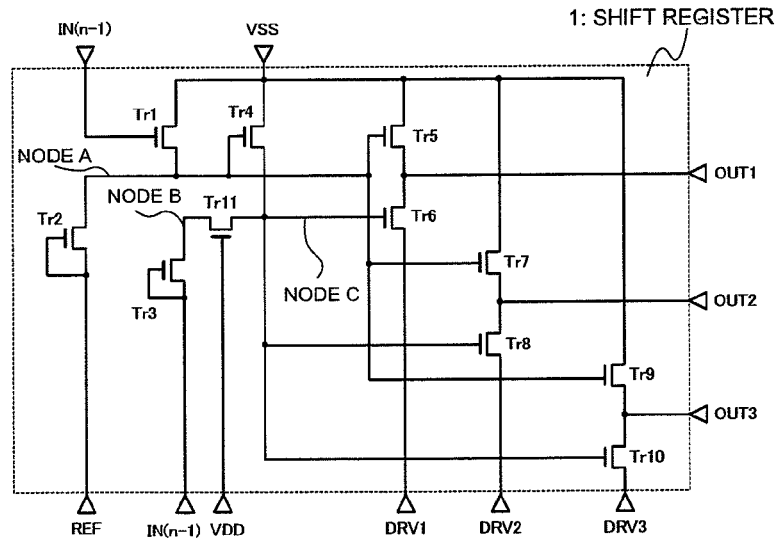

A third example of the present invention will now be described in detail with reference to the drawings. FIGS. 11 and 12 depict circuit diagrams showing the structure of shift register 1 of the present example. The display of the present example is similar to that of Examples 1 and 2. A cross-sectional view of FIG. 3 is similar to that of the first example or 2. Scanning circuit 2 shown in FIG. 2 is of the structure shown in FIG. 4 or 8. The present example differs from the first example or 2 as to the structure of shift register 1 that composes scanning circuit 2. Thus, the structure of the shift register is explained with reference to FIGS. 11A to 11C and 12A to 12C.

Referring to FIG. 11A, shift register 1 of the present example includes NMOS transistors Tr1 to Tr8, Tr11 and Tr12, and terminals IN(n−1), DRV1, DRV2, REF, OUT1, OUT2, VSS and VDD. With shift register 1 of the present example, transistors Tr11 and Tr12 are added to isolate the gate electrodes of transistors Tr6 and Tr8 from node B. Here, the gate electrode of transistor Tr6 is node C1 and a gate of transistor Tr8 is a node C2.

FIG. 11B shows a shift register of FIG. 11A formed by a set of PMOS transistors, as an alternative structure of shift register 1 of the present example. Transistors Tr11 and Tr12 are added, as in the structure of FIG. 11A, so that, if the gate electrode of transistor Tr6 is node C1 and the electrode of transistor Tr8 is node C2, node C1 and C2 are isolated from node B.

In the structure of FIG. 11C, only transistor Tr11 out of transistors Tr11 and Tr12 in FIG. 11A is used. The structure is similar to that of FIG. 11A as to isolation of node B from the gate electrodes of transistors Tr6 and Tr8. However, the structure of FIG. 11C differs from that shown in FIG. 11A in using the gate electrodes of transistors Tr6 and Tr8 in common as node C.

In FIG. 12A, showing another alternative structure of shift register 1 of the present example, transistors Tr11 to Tr13 are added to shift register 1 shown in FIG. 9A. If the gate electrodes of transistors Tr6, Tr8 and Tr10 are labeled nodes C1, C2 and C3, respectively, nodes C1 to C3 are isolated from node B.

The structure of FIG. 12B, as another alternative structure of shift register 1 of the present example, corresponds to the structure of FIG. 12A composed of a set of PMOS transistors. In the present structure, transistors Tr11 to Tr13 are newly added as in the structure of FIG. 12A, so that, if the gate electrodes of transistors Tr6, Tr8 and Tr10 are labeled nodes C1, C2 and C3, respectively, nodes C1 to C3 are isolated from node B.

In the structure of FIG. 12C, only transistor Tr11 out of transistors Tr11 to Tr13 of FIG. 12A is used. Node B is isolated in this case from the gate electrodes of transistors Tr6, Tr8 and Tr10, as in FIG. 12A. However, the present structure differs from that of FIG. 12A in connecting the gate electrodes of transistors Tr6, Tr8 and Tr10 together in common as node C.

Shift registers 1 (SR), shown in FIGS. 11A to 11C, generate two output signals from shift register 1, and hence are similar in this respect to scanning circuit 2 shown in FIG. 4. Shift registers 1 (SR), shown in FIGS. 12A to 12C, generate three output signals from shift register 1, and hence are similar in this respect to scanning circuit 2 shown in FIG. 8.

[Explanation of Operation]

FIGS. 13A to 13D depict timing charts showing the operation of the shift register of the present example. The operation of shift register 1 of the present example differs from that of the shift register of the first example or 2 as to the potential states of node B, the newly added nodes C1 to C3, or node C. These points of difference will now be described.

Figure 13A:
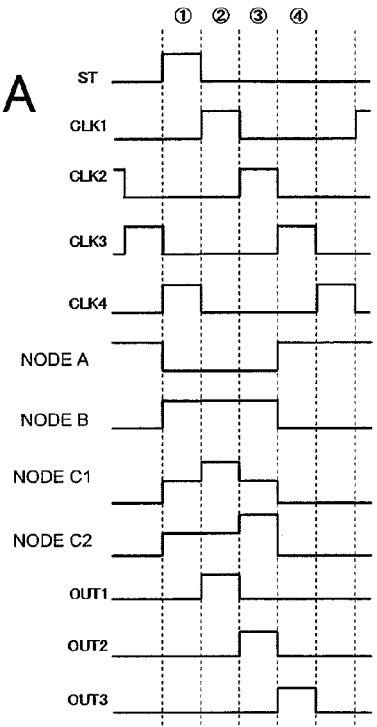
FIGS. 13A to 13D are showing an operation of the shift register of the third example.

FIG. 13A depicts a timing chart for a case where shift register 1 is as shown in FIG. 11A. During the time period 1, transistor Tr3 is turned on, and hence the potential state of nodes B, C1 and C2 goes HIGH. During the time period 2, transistor Tr3 is turned off, so that nodes B, C1 and C2 are in floating states. If clock signal CLK1 goes HIGH, node C1 transitions to a potential higher than the HIGH level due to the bootstrap effect. At this time, the HIGH level of clock signal CLK1 is transmitted via transistor Tr6 to terminal OUT1.

If clock signal CLK2 goes HIGH during the time period 3, node C2 rises to a potential higher than the HIGH level due to the bootstrap effect. At this time, the HIGH level of clock signal CLK2 is transmitted via transistor Tr8 to terminal OUT2. With shift register 1 of the present example, node B is separated from the gate electrodes of transistors Tr6 and Tr8 by transistors Tr11 and Tr12, respectively. Thus, the rise in the potential due to the bootstrap effect when clock signals CLK1 and CLK2 rise to the HIGH level occurs at node C1 or C2 instead of at node B. At this time, a voltage equal to or higher than the power supply voltage (here, a voltage between the HIGH and LOW levels) is not applied to transistor Tr4 connected between node B and VDD. Hence, the drain stress to TR4 is relieved in comparison with the case of the first and second examples. Furthermore, the time interval during which the voltages at nodes C1 and C2 rise to not lower than the power supply voltage under the bootstrap effect is shorter than with node B of FIG. 7A, resulting in relieving the voltage stress otherwise applied to the gate electrodes of transistors Tr6, Tr8.

Figure 13B:
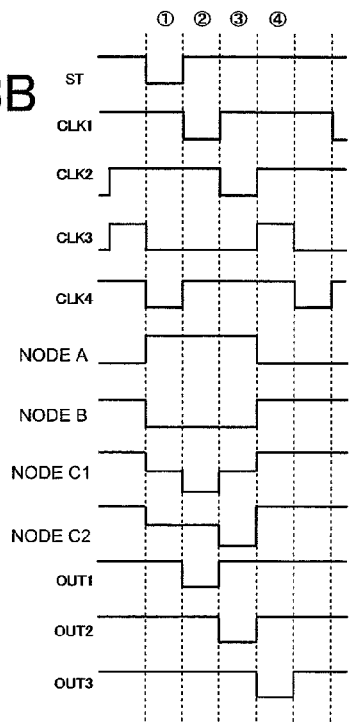

FIG. 13B depicts a timing chart with shift register 1 of FIG. 11B. In FIG. 13B, the operation of shift register 1, composed of a set of PMOS transistors, differs in voltage polarities from shift register 1 composed of a set of NMOS transistors. In short, the potential of nodes B, C1 and C2 in FIG. 11B is reversed in polarity from that in the case of FIG. 13A. Since node B is again separated in this case by transistors Tr11 and Tr12, the potentials at nodes C1 and C2 become lower than the LOW level due to the bootstrap effect. On the other hand, node B is kept at a LOW level (in actuality, at a potential higher than the LOW level by a threshold value of transistor Tr3). At this time, a voltage higher than the power supply voltage (here, a voltage between the HIGH level and the LOW level) is not applied to transistor Tr4 provided between node B and VSS. Hence, the drain stress to TR4 is relieved in comparison with the case of the first and second examples. On the other hand, the voltage stress applied to the gate electrodes of transistors Tr6 and Tr8 is also relieved, as in FIG. 13A.

Figure 13C:
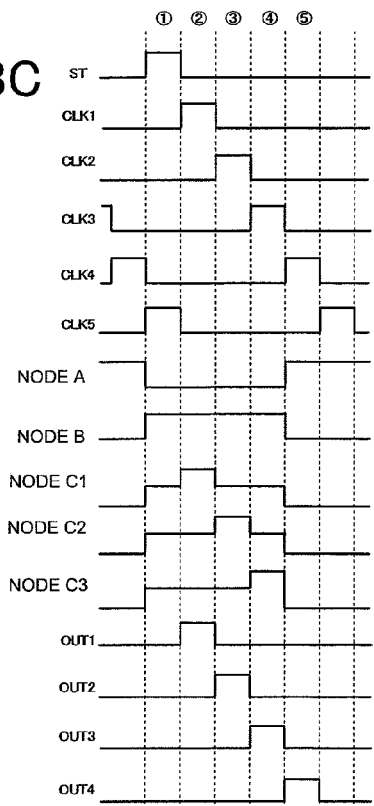

FIG. 13C depicts a timing chart for a case where shift register 1 is configured as shown in FIG. 12A. During the time period 1, transistor Tr3 is turned on, so that nodes B, C1, C2 and C3 are brought HIGH. During the time period 2, transistor Tr3 is turned off, and hence nodes B, C1, C2 and C3 are set to the floating state. If clock signal CLK1 then is brought HIGH, node C1 rises to a potential higher than the HIGH level due to the bootstrap effect. At this time, the HIGH level of clock signal CLK1 is transmitted via transistor Tr6 to terminal OUT1.

If, during the time period 3, clock signal CLK2 goes HIGH, node C2 rises to a potential higher than the HIGH level due to the bootstrap effect. At this time, the HIGH level of clock signal CLK2 is transmitted via transistor Tr8 to terminal OUT2.

If, during the time period 4, clock signal CLK3 goes HIGH, node C3 rises to a potential higher than the HIGH level due to the bootstrap effect. At this time, the HIGH level of clock signal CLK3 is transmitted via transistor Tr10 to terminal OUT3.

With shift register 1 of the present example, node B is separated from the gate electrodes of transistors Tr6, Tr8 and Tr10 by transistors Tr11, Tr12 and Tr13, respectively. Thus, the rise in the potential due to the bootstrap effect when clock signals CLK1, CLK2 and CLK3 rise to the HIGH level occurs at node C1, C2 or C3 instead of at node B. At this time, a voltage equal to or higher than the power supply voltage (here, a voltage between the HIGH and LOW levels) is not applied to transistor Tr4 connected between node B and VDD. Hence, the drain stress to TR4 is relieved in comparison with the case of the first and second examples. On the other hand, the voltage stress applied to the gate electrodes of transistors Tr6, Tr8 and Tr10 may be relieved by the same reason as that set forth above in connection with the case of FIGS. 13A and 13D.

Figure 13D:
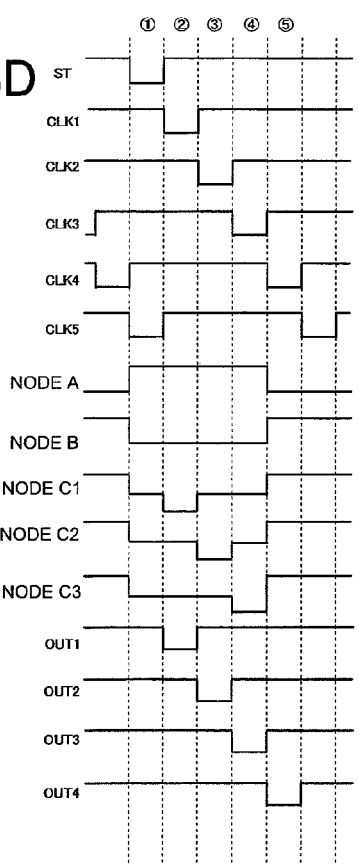

FIG. 13D depicts a timing chart for a case where shift register 1 of FIG. 12B is used as shift register 1. In FIG. 13D, the operation of shift register 1, composed of a set of PMOS transistors, differs in voltage polarities from shift register 1 composed of a set of NMOS transistors. That is, the potential of nodes B, C1, C2 and C3 in FIG. 12B is reversed in polarity from the case of FIG. 13C. In this case, node B is again separated by transistors Tr11, Tr12 and Tr13, and hence the potentials at nodes C1, C2 and C3 become lower than the LOW level due to the bootstrap effect. On the other hand, node B is kept at a LOW level (in actuality, at a potential higher than the LOW level by a threshold value of transistor Tr3). At this time, a voltage higher than the power supply voltage (here, a voltage between the HIGH level and the LOW level) is not applied to transistor Tr4 provided between node B and VSS. Hence, the drain stress to TR4 may be relieved in comparison with the case of the first and second examples. On the other hand, the voltage stress applied to the gate electrodes of transistors Tr6, Tr8 and Tr10 is also relieved by the same reason as discussed in connection with the case of FIGS. 13A to 13D.

With the present example, the meritorious effect discussed in connection with the first and second examples may be obtained and, in addition, voltage stresses by the drain-to-drain voltages or gate voltages of the transistors that make up shift register 1 may be relieved.

Fourth Example

[Explanation of Structure]

Figure 14:
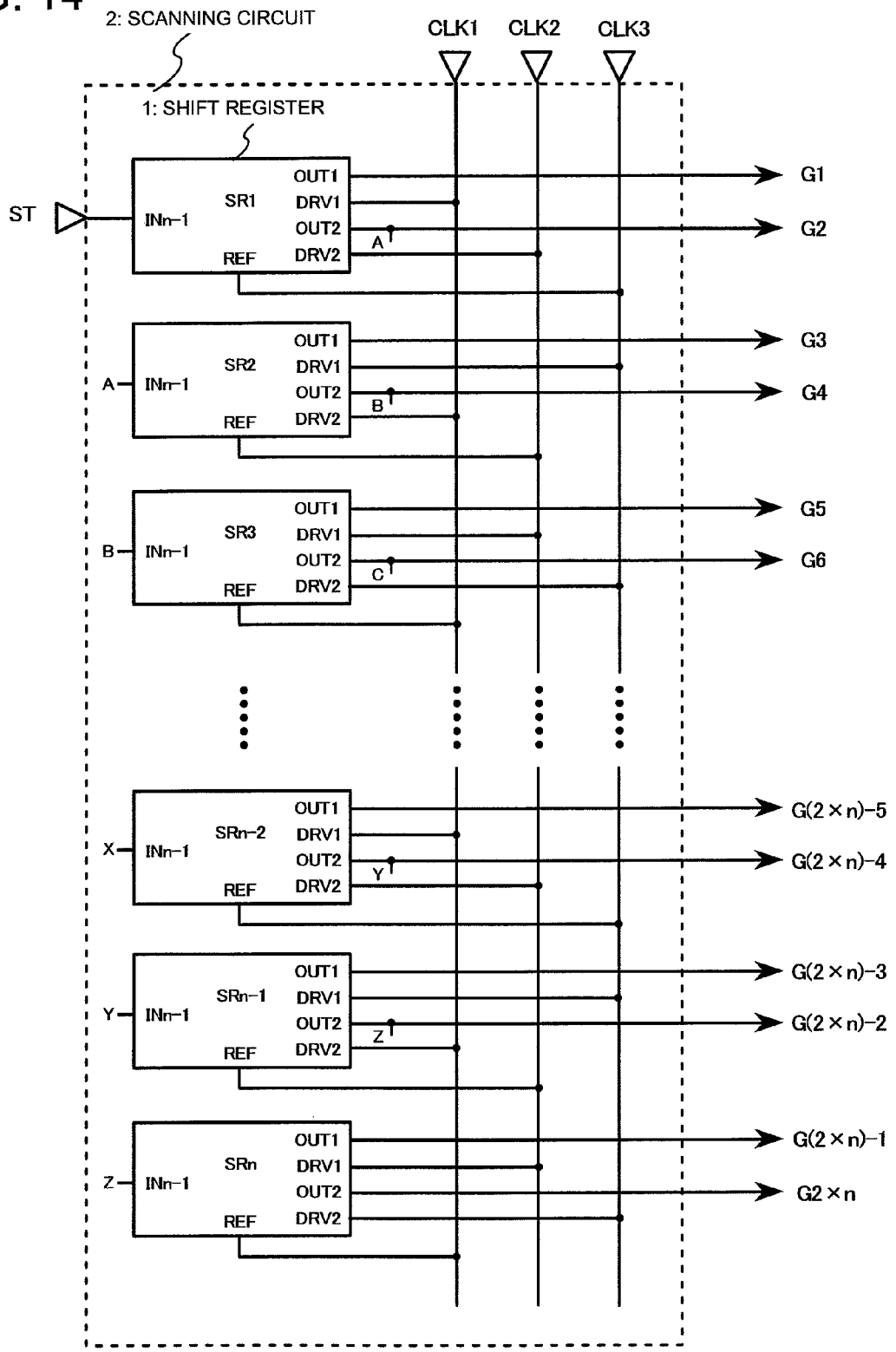
FIG. 14 is a block diagram showing a structure of a scanning circuit of a fourth example.

The structure of a fourth example is now described in detail with reference to the drawings. FIGS. 14 and 16 depict block diagrams showing the structure of the scanning circuit of the present example, and FIGS. 15A, 15B and 17A, 17B depict block diagrams showing the structure of the shift register of the present example.

The display of the present example is similar to that of the first example, and has the configuration shown in FIG. 2. The cross-sectional view shown in FIG. 3 is also similar to that of the first example. The present example differs from the first example as to the structure of the scanning circuit of FIG. 2 and the structure of shift register 1 composing scanning circuit 2. These structures are now described with reference to FIGS. 14 to 17A, 17B.

Scanning circuit 2 includes a plurality of shift registers (SR1, SR2, SR3, ..., SRn−1, SRn) and a set of signal lines (CLK1 to CLK3 and ST). Gate bus lines Gi (i=1 to 2n) are connected to one of two terminals, namely OUT1 and OUT2, of each of shift registers 1 of scanning circuit 2. Output signals of terminals OUT1 and OUT2 are transmitted to gate bus lines Gi (i=1 to 2n) to which are connected the respective terminals. As in the first example, each shift register 1 includes two output signal terminals (OUT1, OUT2). The present example differs from the first example in that three clock signals CLK1, CLK2 and CLK3 are used.

Figure 15A:
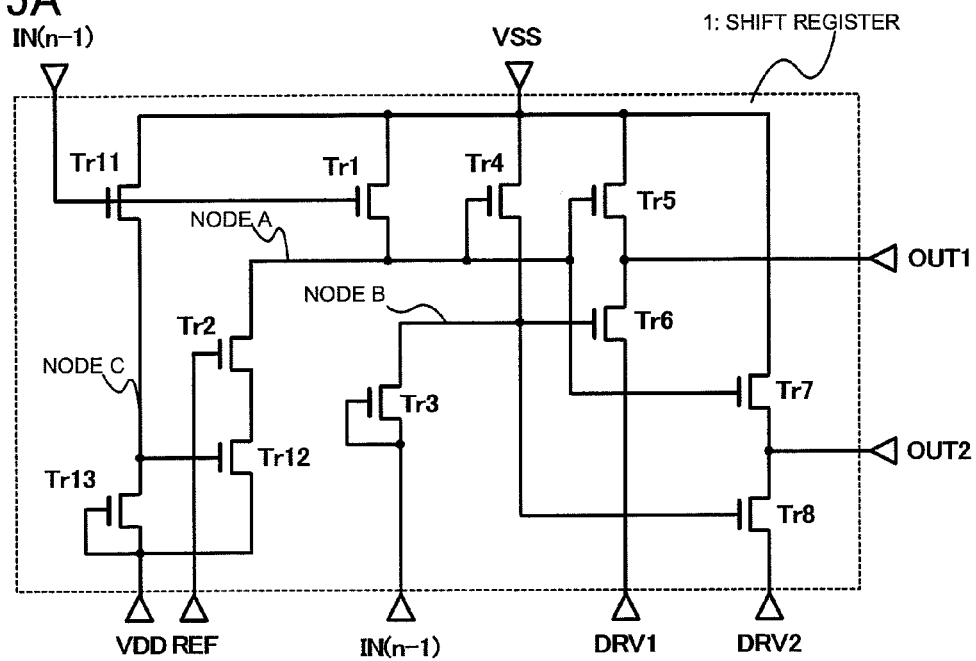
FIGS. 15A and 15B are circuit diagrams showing configurations of a shift register of the fourth example.
Figure 16:
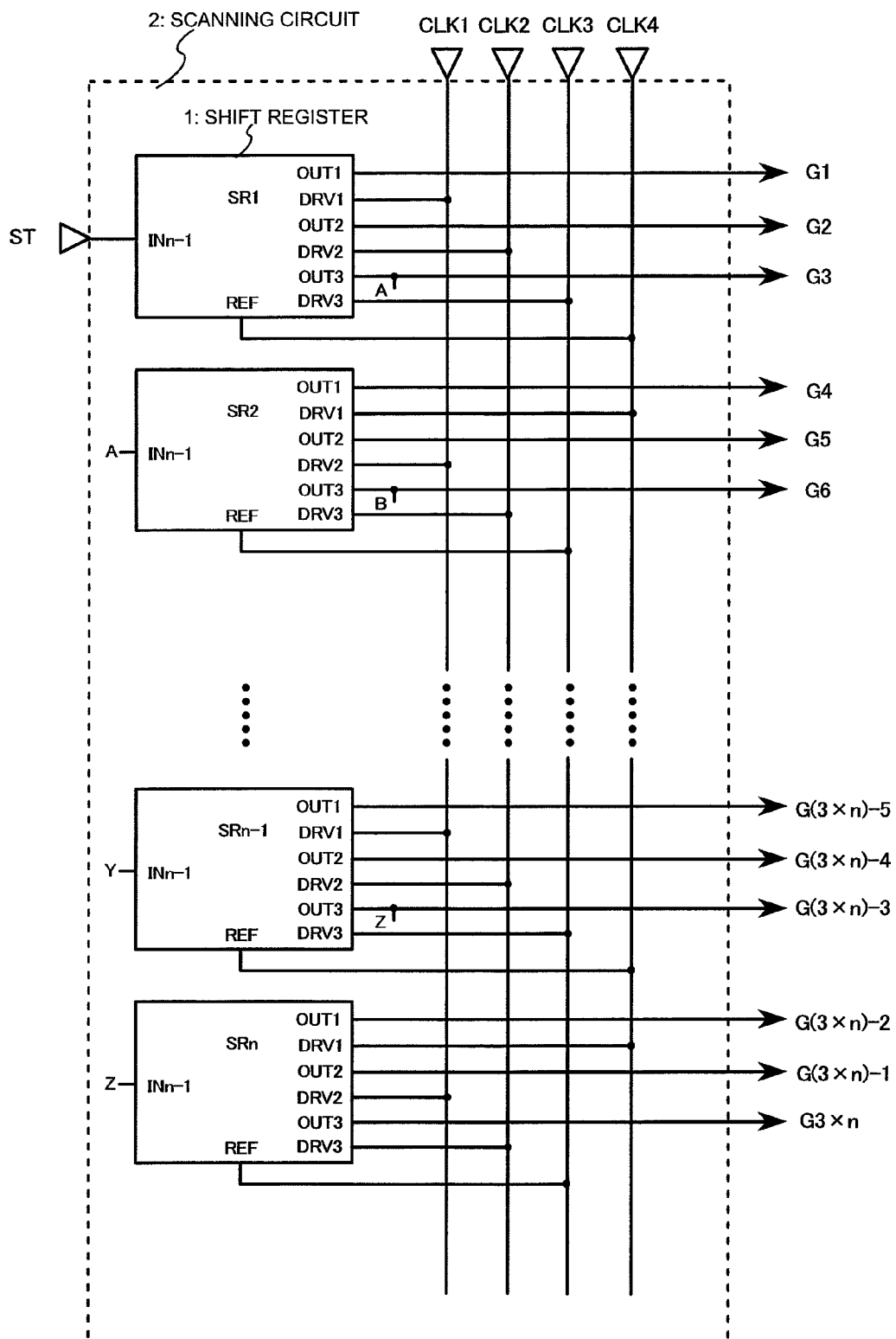
FIG. 16 is a block diagram showing a structure of the scanning circuit of a fourth example.

Referring to FIG. 15A, shift register 1 of the present example includes NMOS transistors Tr1 to Tr8 and transistors Tr11 to Tr13 and terminals IN(n−1), DRV1, DRV2, REF, OUT1, OUT2, VDD and VSS. Shift register 1 of the present example differs from shift register 1 of the first example shown in FIG. 5A in further including transistors Tr11 to Tr13 and in changing the state of interconnection for transistor Tr2. To implement a ratio circuit, the current driving capability of transistor Tr11 needs to be larger than that of transistor Tr13. In more specific terms, the transistor size of transistor Tr11 is desirably larger than that of transistor Tr13. It is observed that terminal IN(n−1) receives a signal from terminal OUT2 of neighboring shift register 1. Terminals DRV1, DRV2 and REF receive clock signals CLK1, CLK2 or CLK3. Terminals OUT1 and OUT2 output a HIGH signal or a LOW signal, depending on the operation of shift register 1, and gate bus lines Gi (i=1 to 2n) receive the output signals. A constant voltage equivalent to a HIGH signal is applied to terminal VDD, whilst a constant voltage equivalent to a LOW signal is applied to terminal VSS.

Figure 15B:
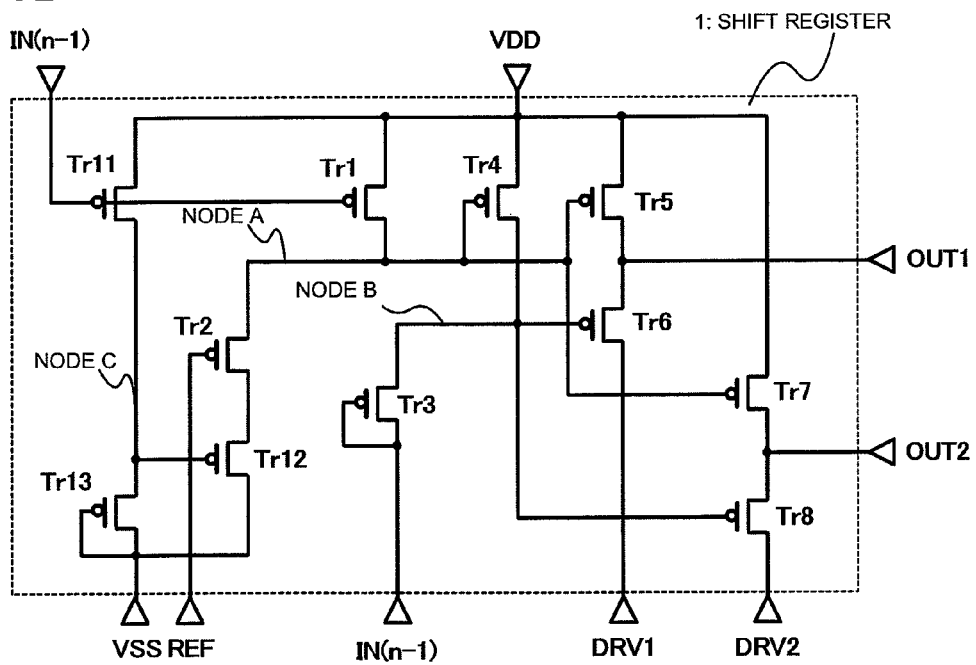

The structure of FIG. 15B, as another alternative structure of shift register 1 of the present example, includes a set of PMOS transistors. Shift register 1 of the present example includes NMOS transistors Tr1 to Tr8 and Tr11 to Tr13 and terminals IN(n−1), DRV1, DRV2, REF, OUT1, OUT2, VSS and VDD.

The transistor size of transistor Tr11 is desirably larger than that of transistor Tr13, as in FIG. 15A. It is observed that terminal IN(n−1) receives a signal from terminal OUT2 of neighboring shift register 1. Terminals DRV1, DRV2 and REF receive clock signals CLK1, CLK2 or CLK3. Terminals OUT1 and OUT2 output a HIGH signal or a LOW signal, depending on the operation of shift register 1, and gate bus lines Gi (i=1 to 2n) receive the output signals. A constant voltage equivalent to a HIGH signal is applied to terminal VDD.

FIG. 16 shows an alternative structure of scanning circuit 2 of the present example. Referring to FIG. 16, scanning circuit 2 includes a plurality of shift registers (SR1, SR2, SR3, ..., SRn−1, SRn) and a set of signal lines (CLK1 to CLK4 and ST). Gate bus lines Gi (i=1 to 3n) are connected to terminals OUT1, OUT2 or OUT3 of each of shift registers 1 of scanning circuit 2. Output signals of three terminals OUT1 to OUT3 are transmitted to gate bus lines Gi (i=1 to 3n) to which are connected the respective terminals. As in the first example, each shift register 1 includes three output signal terminals (OUT1, OUT2 and OUT3). The present example differs from the first example in that clock signals CLK1, CLK2, CLK3 and CLK4 are used as clock signals.

Figure 17A:
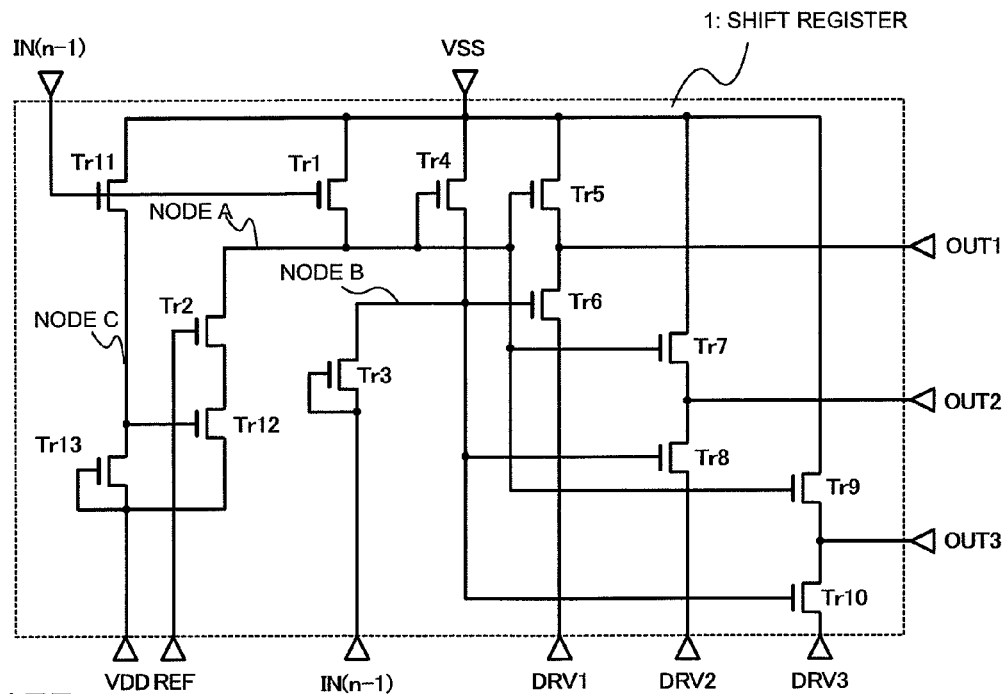
FIGS. 17A and 17B are circuit diagrams showing alternative configurations of the shift register of the fourth example.

Referring to FIG. 17A, shift register 1 of the present example includes NMOS transistors Tr1 to Tr13 and terminals IN(n−1), DRV1, DRV2, DRV3, REF, OUT1, OUT2, OUT3, VDD and VSS. Shift register 1 of the present example differs from shift register 1 of the second example shown in FIG. 9A in further including transistors Tr11 to Tr13 and in changing the state of interconnection for transistor Tr2. The transistor size of transistor Tr11 is desirably larger than that of transistor Tr13, as in FIGS. 15A and 15B. Terminal IN(n−1) receives a signal from terminal OUT3 of neighboring shift register 1. Terminals DRV1, DRV2, DRV3 and REF receive clock signals CLK1, CLK2, CLK3 or CLK4. Terminals OUT1, OUT2 and OUT3 output a HIGH signal or a LOW signal, depending on the operation of shift register 1, and gate bus lines Gi (i=1 to 3n) receive the output signals. A constant voltage equivalent to a HIGH signal is applied to terminal VDD, whilst a constant voltage equivalent to a LOW signal is applied to terminal VSS.

Figure 17B:
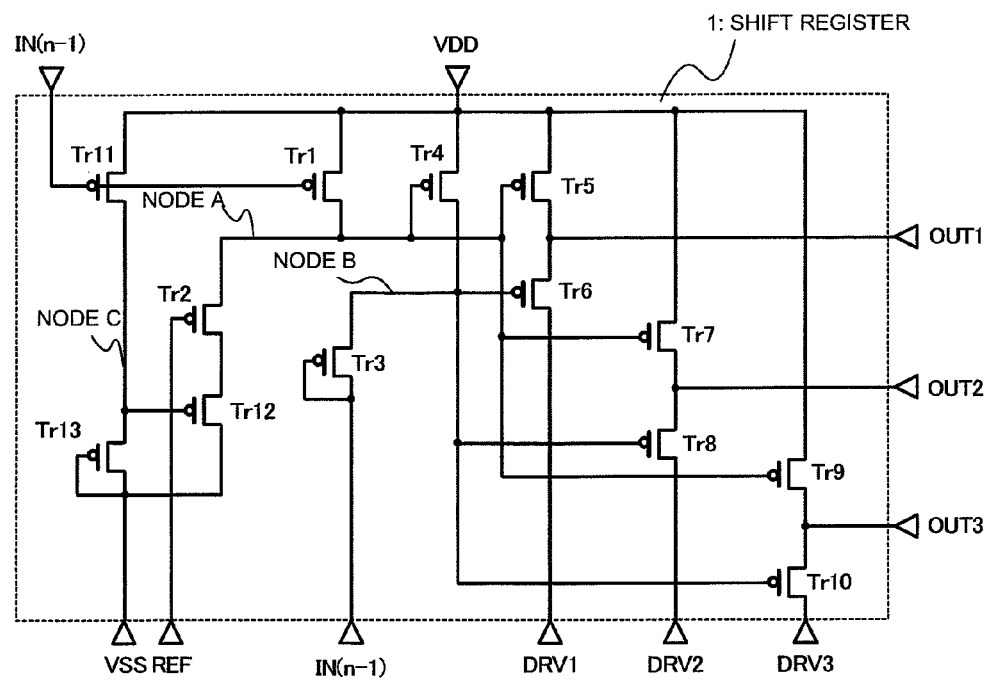

The structure of FIG. 17B, as another alternative structure of shift register 1 of the present example, includes a set of PMOS transistors. Shift register 1 of the alternative structure of the present example includes PMOS transistors Tr1 to Tr13 and terminals IN(n−1), DRV1, DRV2, DRV3, REF, OUT1, OUT2, OUT3, VDD and VSS. The transistor size of transistor Tr11 is desirably larger than that of transistor Tr13, as in FIGS. 15 and 17(A). Terminal IN(n−1) receives a signal from terminal OUT3 of the neighboring shift register 1. Terminals DRV1, DRV2, DRV3 and REF receive clock signals CLK1, CLK2, CLK3 or CLK4. Terminals OUT1, OUT2 and OUT3 output a HIGH signal or a LOW signal, depending on the operation of shift register 1, and gate bus lines Gi (i=1 to 3n) receive the output signals. A constant voltage equivalent to a HIGH signal is applied to terminal VDD, while a constant voltage equivalent to a LOW signal is applied to terminal VSS.

[Explanation of Operation]

Figure 18A:
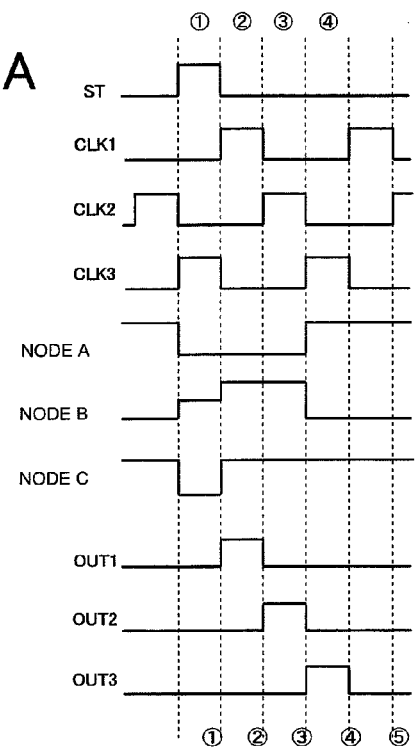
FIGS. 18A to 18D are timing charts showing an operation of the shift register of the fourth example.

The operation of the present example is explained with reference to FIGS. 18A to 18D. Referring first to FIG. 18A, the operation of shift register 1, shown in FIG. 15A, is explained.

During the time period 1, start signal ST transitions from LOW level to HIGH level. When the HIGH level of start signal ST is delivered to terminal IN(n−1) of shift register 1 (SR1), transistors Tr1 and Tr11 are turned on, while nodes A and C are brought LOW. With node C brought LOW, transistor Tr12 is turned off. Since transistor Tr3 is simultaneously brought LOW, transistor Tr12 is turned off. Since transistor Tr3 is simultaneously turned on, node B is set to HIGH level (in actuality, to a voltage corresponding to the HIGH level potential less the threshold voltage of transistor Tr3). During the time period 1, clock signal CLK3 coupled to terminal REF transitions from the LOW level to the HIGH level. Transistor Tr2 is thus turned on. However, since transistor Tr12 is off, as described above, there is no possibility of shorting of the VSS terminal and node A.

If, during the time period 2, start signal ST goes LOW, transistors Tr1, Tr11 and Tr3 are all turned off. With transistor Tr11 off, node C goes HIGH, so that transistor Tr12 is turned on. Since transistor Tr3 is turned off, node B is in a floating state. If, in this state, clock signal CLK1 connected to terminal DRV1 transitions from LOW to HIGH, the potential at node B rises to a potential higher than the HIGH level due to the bootstrap effect. At this time, the gate voltage not lower than the HIGH level is applied to the gates of transistors Tr6 and Tr8. Thus, the HIGH level of clock signal CLK1 is output via transistor Tr6 to terminal OUT1 without being lowered in potential. Terminal OUT1 is connected to gate bus line G1, and hence the potential on G1 also goes HIGH.

If, during the time period 3, clock signal CLK1 transitions from LOW to HIGH, terminal OUT1 is also set to a LOW level. Also, if clock signal CLK2 transitions from LOW level to HIGH level, node B is set to a potential higher than the HIGH level. Hence, the HIGH level is transferred via transistor Tr8 to terminal OUT2 without being lowered in potential. Since the signal of terminal OUT2 is connected to gate bus line G2, the potential of G2 also goes HIGH.

If, during the next time period 4, clock signal CLK2 transitions from the HIGH level to the LOW level, terminal OUT2 is also set to the LOW level. Since clock signal CLK3, coupled to terminal REF, goes HIGH, transistor Tr2 is turned on. Since node C is HIGH, transistor Tr12 is also turned on. Hence, terminal VDD and node A are shorted via transistors Tr12 and Tr2. At this time, node A rises from the LOW level to the HIGH level (in actuality, to the potential lower than the HIGH level by a value corresponding to the threshold value of transistor Tr12 or Tr2). Hence, transistors Tr5 and Tr7 are both turned on to keep terminals OUT1 and OUT2 at the LOW level. On the other hand, since transistor Tr4 is turned on, transistors Tr6 and Tr8 are both turned off to electrically isolate terminals DRV1, DRV2 from terminals OUT1 and OUT2.

Figure 18B:
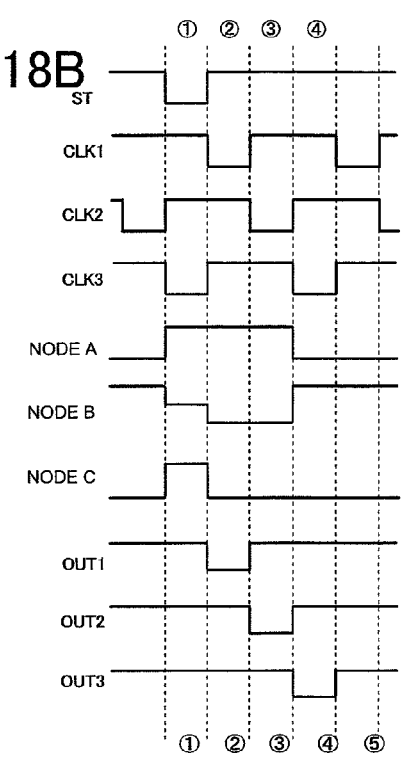

FIG. 18B depicts a timing chart showing the operation of shift register 1 shown in FIG. 15B. Shift register 1 shown in FIG. 15B is shift register 1 of FIG. 15A, the NMOS transistors of which are all changed to PMOS transistors. Hence, the operation of FIG. 18B is similar to that shown by the timing chart of FIG. 18A provided that the voltage polarity of the on-state and that of the off-state are reversed. The LOW level of clock signal CLK1 coupled to terminal DRV1 and that of clock signal CLK2 coupled to terminal DRV2 are transferred to terminals OUT1 and OUT2, respectively. During the time period 1, clock signal CLK3 coupled to terminal REF transitions from HIGH level to LOW level, so that transistor Tr2 is turned on. However, since transistor Tr12 is turned off, as described above, there is no possibility of shorting of terminal VDD and node A.

Figure 18C:
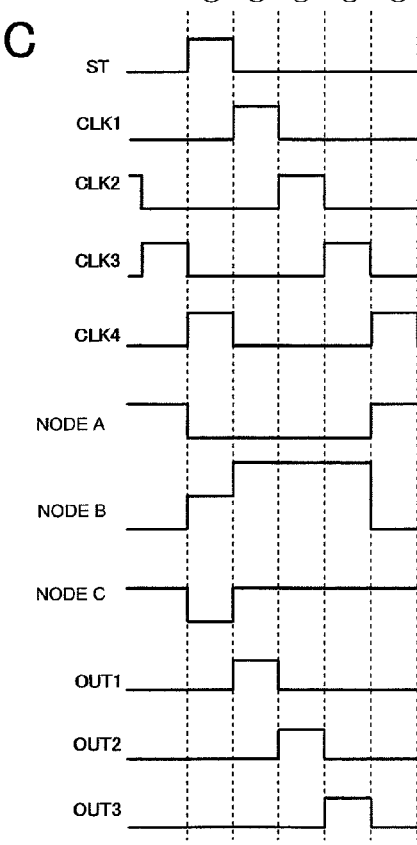

Referring to FIG. 18C, the operation of shift register 1, shown in FIG. 17A, is explained. During the time period 1, start signal ST transitions from LOW level to HIGH level. When the HIGH level of start signal ST is applied to terminals IN(n−1) of shift register 1 (SR1), transistors Tr1 and Tr11 are turned on, thus shorting node A and terminal VSS and shorting node C and terminal VSS. Hence, both nodes A and C are brought LOW. Since node C is brought LOW, transistor Tr12 is turned off. Since transistor Tr3 is also turned on, node B is set to a HIGH level (in actuality, a voltage corresponding to the potential of HIGH level less the threshold voltage of transistor Tr3).

If, during the time period 2, start signal ST goes LOW, transistors Tr1, Tr11 and Tr3 are all turned off. Since transistor Tr11 is turned off, node C goes HIGH to turn TR12 on. Since transistor Tr3 is turned off, node B is in the floating state. If, in this state, clock signal CLK1 coupled to terminal DRV1 transitions from LOW to HIGH, the potential of node B rises from LOW to a potential higher than the HIGH level due to the bootstrap effect. At this time, the gate voltage higher than the HIGH level is applied to the gates of transistors Tr6 and Tr8. Thus, the HIGH level of clock signal CLK1 is transferred via transistor Tr6 to terminal OUT1 without being lowered in potential. Since the signal of terminal OUT1 is connected to gate bus line G1, the potential of G1 also goes HIGH.

If, during the next time period 3, clock signal CLK1 transitions from the HIGH level to the LOW level, terminal OUT1 is also set to the LOW level. Since clock signal CLK2 also transitions from the HIGH level to the LOW level, node B is set to a potential higher than the HIGH level. Thus, the HIGH level is transferred via transistor Tr8 to terminal OUT2 without being lowered in potential. Since the signal of terminal OUT2 is connected to gate bus line G2, the potential of G2 also goes HIGH.

If, during the next time period 4, clock signal CLK2 transitions from the HIGH level to the LOW level, terminal OUT2 is also set to the LOW level. Since clock signal CLK3 transitions from the LOW level to the HIGH level, node B is set to a potential higher than the HIGH level. Thus, the HIGH level is transferred via transistor Tr10 to terminal OUT3 without being lowered in potential. Since the signal of terminal OUT3 is connected to gate bus line G3, the potential of G3 also goes HIGH.

If, during the time period 5, clock signal CLK3 transitions from HIGH level to LOW level, terminal OUT3 is also set to LOW level. Since clock signal CLK4, connected to terminal REF, goes HIGH, transistor Tr2 is turned on. Since node C is HIGH, transistor Tr12 is also turned on. Hence, terminal VDD and node A are shorted via transistors Tr12 and Tr2, so that node A rises from the LOW level to the HIGH level (in actuality, to the HIGH level less the threshold value of transistor Tr12 or Tr2). At this time, transistors Tr5, Tr7 and Tr9 are all turned on so that terminals OUT1, OUT2 and OUT3 are shorted to VSS and kept at LOW level. On the other hand, since transistor Tr4 is turned on, node B is shorted to VSS. Hence, transistors Tr6, Tr8 and Tr10 are all turned off, so that terminals DRV1, DRV2 and DRV3 are electrically isolated from terminals OUT1, OUT2 and OUT3, respectively.

Figure 18D:
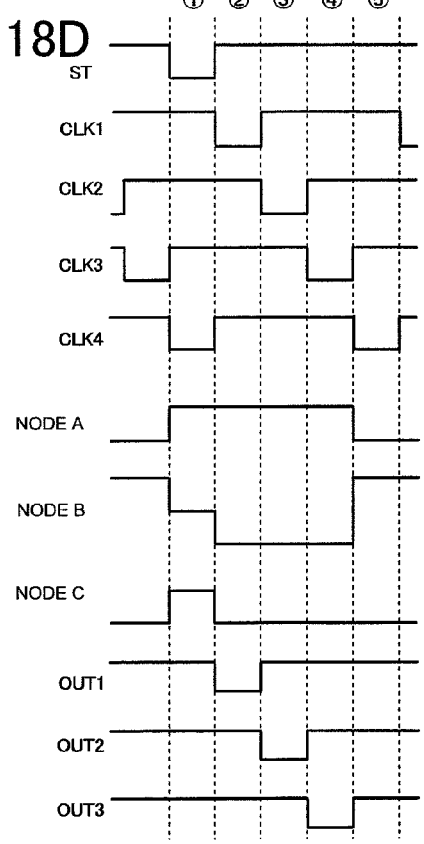

FIG. 18D depicts a timing chart showing the operation of shift register 1 shown in FIG. 17B. Shift register 1 shown in FIG. 17B is shift register 1 of FIG. 17A, the NMOS transistors of which are all changed to PMOS transistors. Hence, the operation of FIG. 18D is similar to that shown by the timing chart of FIG. 18C provided that the voltage polarity of the on-state and that of the off-state are reversed. The LOW level of clock signal CLK1 coupled to terminal DRV1, that of clock signal CLK2 coupled to terminal DRV2 and that of clock signal CLK3 coupled to terminal DRV3 are transferred to terminals OUT1, OUT2 and OUT3, respectively.

With the present example, described above, the scanning circuit 2, having the meritorious effect of the first and second examples, may be implemented with a smaller number of clock signal lines. In addition, with the present example, node A may be set to VDD (in case shift register 1 is that shown in FIG. 15A or 17A) or VSS (in case shift register 1 is that shown in FIG. 15B or 17B) using a clock signal of the directly previous phase with respect to clock signal CLK1 output to terminal OUT1 of shift register 1. It is observed that the clock signal of the directly previous phase as set forth above is clock signal CLK3 or CLK4 in case shift register 1 is that shown in FIGS. 15A and 15B or that shown in FIGS. 17A and 17B, respectively. Thus, with the present structure, circuit malfunctions, ascribable to potential variations at node A, may be suppressed more strongly than with the structure of the previous examples.

Fifth Example

[Explanation of Structure]

Figure 19:
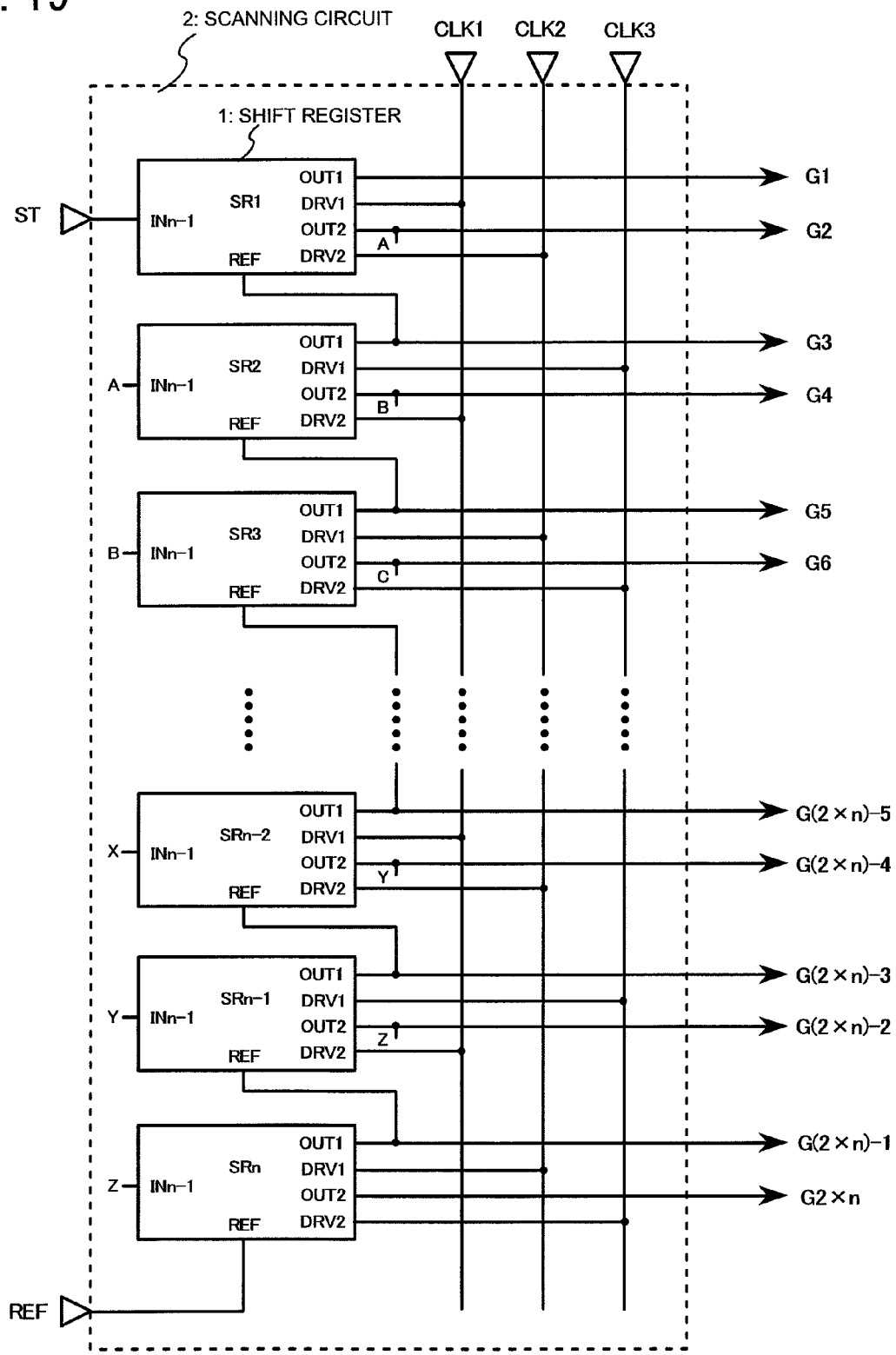
FIG. 19 is a block diagram showing a structure of a scanning circuit of a fifth example.
Figure 20:
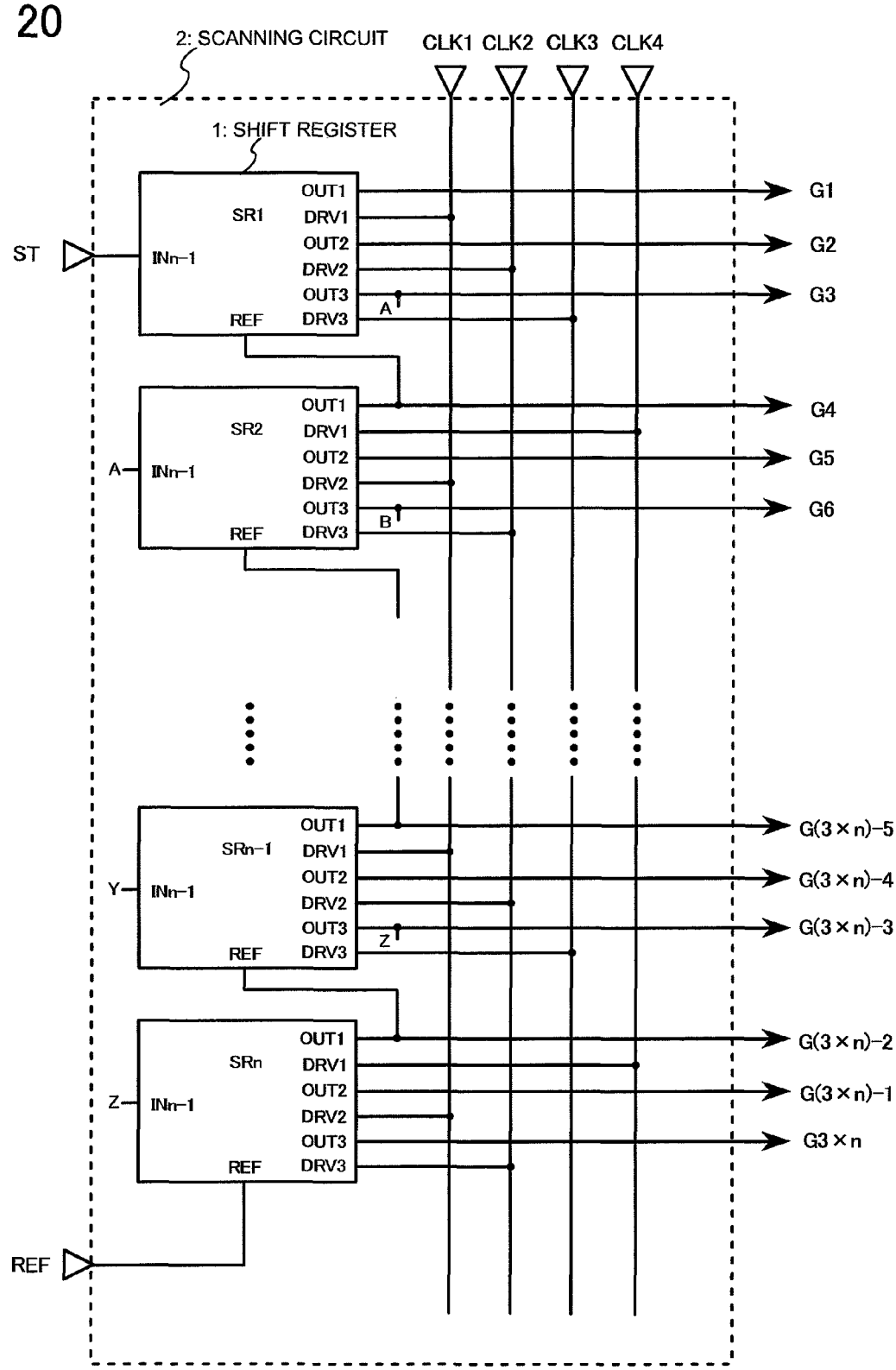
FIG. 20 is a block diagram showing an alternative structure of the scanning circuit of the fifth example.
Figure 21:
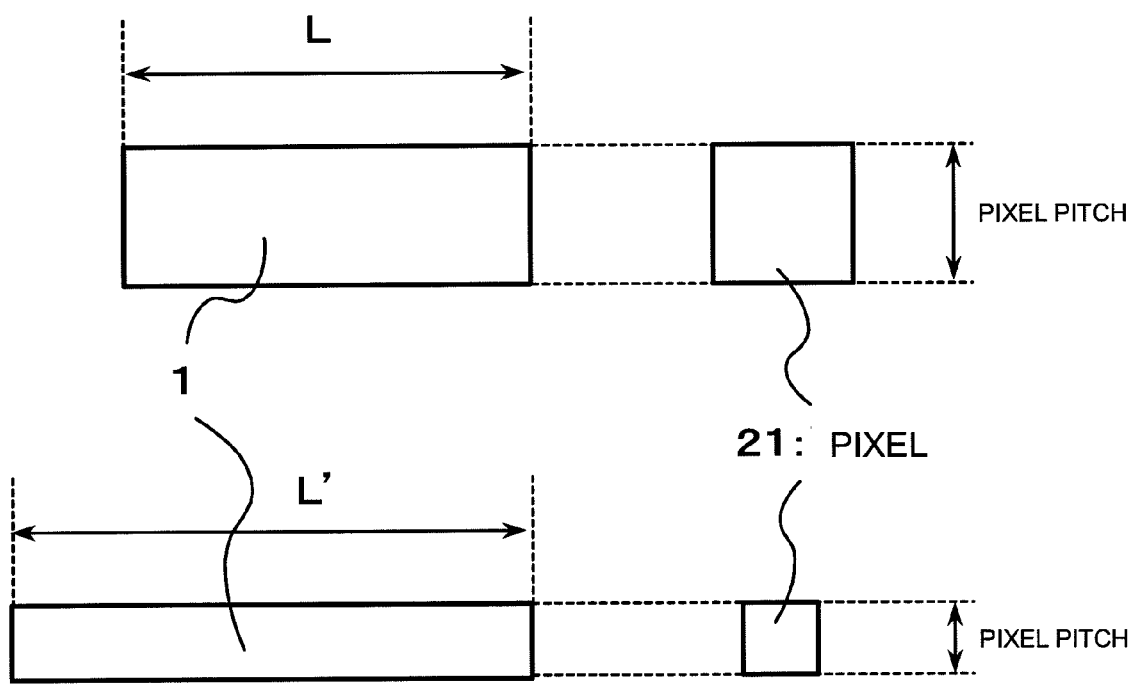
FIG. 21 is a diagrammatic view for illustrating a pixel pitch and circuit width L.

The display of the present example is similar in its structure to the previous examples. The structure of shift register 1 of any of the previous examples may be used for the present example. However, the structure of scanning circuit 2 of the present example differs from that of the previous examples. FIGS. 19 and 20 depict a block diagram of scanning circuit 2 of the present example.

Referring first to FIG. 19, a structure of the scanning circuit of the present example is explained. Scanning circuit 2 includes a plurality of shift registers (SR1, SR2, SR3, ..., SRn−1, SRn) and a set of signal lines (CLK1 to CLK3, ST and REF). The difference in the structure from the previous examples resides in the following points. That is, terminal REF of shift register 1 is coupled not to the clock signal but to terminal OUT1 of neighboring shift register 1. In addition, an external signal is delivered via a REF signal line to terminal REF of the last stage shift register (SRn). It is observed that shift register 1 may be that of the first example, shown in FIGS. 5A and 5B, that of the third example, shown in FIGS. 11A to 11C or that of the fourth example, shown in FIGS. 15A and 15B, because it is sufficient that two gate bus lines Gi (i=1 to 2n) are designed to be driven from a single shift register 1.

Referring now to FIG. 20, an alternative structure of the scanning circuit of the present example is explained. Scanning circuit 2 includes a plurality of shift registers (SR1, SR2, SR3, ..., SRn−1, SRn) and a set of signal lines (CLK1 to CLK4, ST and REF). As in the structure of FIG. 19, the difference in the structure from the previous examples resides in the following points. That is, terminal REF of shift register 1 is coupled not to the clock signal but to terminal OUT1 of neighboring shift register 1. In addition, an external signal is delivered via a REF signal line to terminal REF of the last stage shift register (SRn). It is observed that shift register 1 may be that of the second example, shown in FIGS. 9A and (B), that of the third example, shown in FIGS. 12A to 12C or that of the fourth example, shown in FIGS. 17A and B, because it is sufficient that three gate bus lines Gi (i=1 to 3n) are designed to be driven from a single shift register 1.

[Explanation of Operation]

Shift register 1, forming scanning circuit 2 shown in FIGS. 19 and 20, may be of the structure of any of the previous examples, as set forth above. By the operations of shift register 1 of each of the previous examples as described in the examples concerned, output signals are generated from terminals OUT1 and OUT2 (and also terminal OUT3, as the case may be). With the present example, terminal REF of shift register 1 receives an output signal of terminal OUT1 of the neighboring shift register 1, instead of receiving the clock signal, and is controlled by the so received output signal. It should be observed that the external signal REF needs to be delivered to the last stage shift register 1 (SRn) because of absence of a proper signal.

The present example is directed to a scanning circuit that is controlled by a three-phase clock when the sole shift register 1 drives two gate bus lines Gi (i=1 to 2n), and that is controlled by a four-phase clock when the sole shift register 1 drives two gate bus lines Gi (i=1 to 3n). The present example is also directed to a display provided with the scanning circuit.

Although the first to fifth examples have been described above, it should be observed that the circuit structures or the driving methods shown in these examples are merely illustrative. That is, any other suitable circuit structures or the driving methods may be used provided that these other suitable circuit structures or the driving methods may accomplish equivalent functions or meritorious effects.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A shift register comprising:
 a first output circuit controlled by a first clock signal to output a signal to a first output signal line;
 a second output circuit controlled by a second clock signal with a phase different from a phase of the first clock signal to output a signal to a second output signal line;
 a first control signal line connected to the first and second output circuits; and
 a second control signal line connected to the first and second output circuits, wherein
 each of the first and second output circuits comprises first and second transistors;
 the first transistor of the first output circuit includes a gate connected to the first control signal line, a first terminal connected to a power supply, and a second terminal connected to the first output signal line;
 the second transistor of the first output circuit includes a gate connected to the second control signal line, a first terminal connected to a signal line for the first clock signal, and a second terminal connected to the first output signal line;
 the first transistor of the second output circuit includes a gate connected to the first control signal line, a first terminal connected to the power supply, and a second terminal connected to the second output signal line; and
 the second transistor of the second output circuit includes a gate connected to the second control signal line, a first terminal connected to a signal line for the second clock signal, and a second terminal connected to the second output signal line.

2. The shift register according to claim 1, wherein a reset circuit switches the first transistors of the first and second output circuits between a conducting state and a non-conducting state to reset the first and second output circuits.

3. The shift register according to claim 1, wherein the first and second transistors are either both NMOS transistors or both PMOS transistors.

4. A display comprising:
 a pixel array that includes a plurality of pixels; and
 a scanning circuit that activates the plurality of pixels by the shift register according to claim 1.

5. The display according to claim 4, wherein the scanning circuit includes a plurality of the shift registers connected in cascade so that the first or second output signal line of a previous stage shift register delivers an input signal to the next stage shift register; and first and second output signal lines of each of the plurality of the shift registers activate the plurality of pixels.

6. The display according to claim 4, wherein sub-pixels composing the plurality of pixels are arranged along a scanning direction of the scanning circuit.

7. A shift register comprising:
a first output circuit controlled by a first clock signal to output a signal to a first output signal line;
a second output circuit controlled by a second clock signal with a phase different from a phase of the first clock signal to output a signal to a second output signal line;
a first control signal line connected to the first and second output circuits;
a second control signal line connected to the first and second output circuits; and
a reset circuit activated by a third clock signal of the same period as those of the first and second clock signals, to drive the first control signal line to reset the first and second output circuits.

8. A method for driving a shift register including a first output circuit and a second output circuit, the method comprising:
controlling the first output circuit by a first clock signal to output a signal to a first output signal line;
controlling the second output circuit by a second clock signal with a phase different from a phase of the first clock signal to output a signal to a second output signal line; and
controlling the first and second output circuits by first and second control signal lines connected to the first and second output circuits, wherein
each of the first and second output circuits includes first and second transistors;
the first transistor of the first output circuit includes a gate connected to the first control signal line, a first terminal connected to a power supply, and a second terminal connected to the first output signal line;
the second transistor of the first output circuit includes a gate connected to the second control signal line, a first terminal connected to a signal line for the first clock signal, and a second terminal connected to the first output signal line;
the first transistor of the second output circuit includes a gate connected to the first control signal line, a first terminal connected to the power supply, and a second terminal connected to the second output signal line; and
the second transistor of the second output circuit includes a gate connected to the second control signal line, a first terminal connected to a signal line for the second clock signal, and a second terminal connected to the second output signal line.

9. The method for driving a shift register according to claim 8 further comprising: driving the first control signal line by a third clock signal with the same period as those of the first and second clock signals to switch the first transistors of the first and second output circuits between a conducting state and a non-conducting state.

10. The method for driving a shift register according to claim 9 further comprising:
driving the first control signal line during a first clock period to switch the first transistors of the first and second output circuits from a first state to a second state;
outputting the first clock signal from the first output circuit during a second clock period;
outputting the second clock signal from the second output circuit during a third clock period; and
driving the first control signal line by the third clock signal during an Nth clock period, N being an integer not smaller than 4, to switch the first transistors of the first and second output circuits from the second state to the first state.

11. The method for driving a shift register according to claim 10, wherein a phase of the first and second clock signals for the first clock period is the same with that for the Nth clock period.

* * * * *